US007622744B2

(12) United States Patent
Sakata et al.

(10) Patent No.: US 7,622,744 B2
(45) Date of Patent: Nov. 24, 2009

(54) LIGHT EMITTING MATERIAL, LIGHT EMITTING ELEMENT, LIGHT EMITTING DEVICE AND ELECTRONIC DEVICE

(75) Inventors: Junichiro Sakata, Kanagawa (JP); Yoshiaki Yamamoto, Kanagawa (JP); Takahiro Kawakami, Kanagawa (JP); Tomoya Aoyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 35 days.

(21) Appl. No.: 11/679,444

(22) Filed: Feb. 27, 2007

(65) Prior Publication Data

US 2007/0215880 A1 Sep. 20, 2007

(30) Foreign Application Priority Data

Mar. 3, 2006 (JP) .............................. 2006-058579

(51) Int. Cl.
*H01L 33/00* (2006.01)

(52) U.S. Cl. .............................. 257/87; 257/79; 257/86; 257/102; 257/103; 257/E33.013

(58) Field of Classification Search ................... 257/79, 257/86, 87, 102, 103, E33.013
See application file for complete search history.

(56) References Cited

U.S. PATENT DOCUMENTS

| | | | |
|---|---|---|---|
| 2,743,239 A | 4/1956 | Froelich | |
| 5,087,531 A | 2/1992 | Terada et al. | |
| 5,239,228 A | 8/1993 | Taniguchi et al. | |
| 5,314,759 A | 5/1994 | Harkonen et al. | |
| 5,356,657 A | 10/1994 | Terada et al. | |
| 6,046,465 A * | 4/2000 | Wang et al. | 257/98 |
| 6,428,207 B1 | 8/2002 | Steklenski et al. | |
| 6,429,448 B1 | 8/2002 | Moore et al. | |

(Continued)

FOREIGN PATENT DOCUMENTS

EP 1 241 684 9/2002

(Continued)

OTHER PUBLICATIONS

Noboru Miura et al.; "High-Luminance Blue-Emitting $BaA1_2S_4$:Eu Thin-Film Electroluminescent Devices"; *Jpn. J. Appl. Phys.* vol. 38, Part 2, No. 11B; pp. L1291-L1292; Nov. 15, 1999.

(Continued)

*Primary Examiner*—Victor A Mandala
(74) *Attorney, Agent, or Firm*—Fish & Richardson P.C.

(57) ABSTRACT

The present invention provides a light emitting material having high electric conductivity, and further a light emitting element which can be driven at low voltage. Light emitting devices and electronic devices with reduced power consumption can also be provided. A light emitting element including a light emitting material is provided in which a first electrode 101, a first insulating layer 102, a light emitting layer 103, a second insulating layer 104 and a second electrode 105 are provided over a first electrode 101, the light emitting layer 103 includes an inorganic compound that is any of a sulfide, a nitride and an oxide as a base material; at least one element selected from the group consisting of copper, silver, aluminum, fluorine and chlorine, as a luminescent center material; manganese; and either gallium phosphide or gallium antimonide.

8 Claims, 16 Drawing Sheets

U.S. PATENT DOCUMENTS

| | | | |
|---|---|---|---|
| 7,176,616 | B2 | 2/2007 | Yamashita |
| 0,194,321 | A1 | 8/2007 | Yamazaki et al. |
| 2004/0169160 | A1 | 9/2004 | Watabe et al. |
| 2006/0181197 | A1 | 8/2006 | Nago et al. |
| 2007/0171144 | A1 | 7/2007 | Tanada |
| 2007/0176535 | A1 | 8/2007 | Sakata |
| 2007/0176536 | A1 | 8/2007 | Sakata et al. |
| 2007/0187699 | A1 | 8/2007 | Sakata et al. |
| 2007/0190235 | A1 | 8/2007 | Yamazaki et al. |
| 2007/0190675 | A1 | 8/2007 | Yamazaki et al. |
| 2007/0194306 | A1 | 8/2007 | Yamazaki et al. |
| 2007/0194334 | A1 | 8/2007 | Honda |
| 2007/0205416 | A1 | 9/2007 | Sakata et al. |
| 2007/0205417 | A1 | 9/2007 | Ohara et al. |
| 2007/0205428 | A1 | 9/2007 | Katayama et al. |
| 2007/0216293 | A1 | 9/2007 | Yokoyama et al. |
| 2007/0221888 | A1 | 9/2007 | Sakata |

FOREIGN PATENT DOCUMENTS

| | | |
|---|---|---|
| JP | 32-009217 | 10/1932 |
| JP | 32-009217 | 10/1957 |
| JP | 50-039717 | 4/1975 |
| JP | 56-138890 | 10/1981 |
| JP | 59-181485 | 10/1984 |
| JP | 01-225095 | 9/1989 |
| JP | 02-020590 | 1/1990 |
| JP | 02-152193 | 6/1990 |
| JP | 02-173181 | 7/1990 |
| JP | 08-064361 | 3/1996 |
| JP | 11-339964 | 12/1999 |
| JP | 2001-250691 | 9/2001 |
| JP | 2003-165972 | 6/2003 |
| JP | 2003-173878 | 6/2003 |
| JP | 2004-182810 | 7/2004 |
| JP | 2004-265866 | 9/2004 |
| JP | 2005-139372 | 6/2005 |
| JP | 2005-162948 | 6/2005 |
| JP | 2005-336275 | 12/2005 |
| WO | WO2005-004546 | 1/2005 |
| WO | WO2006-009124 | 1/2006 |

OTHER PUBLICATIONS

International Search Report (Application No. PCT/JP2007/053442), dated May 15, 2007, 4 pages.

Written Opinion (Application No. PCT/JP2007/053442), dated May 15, 2007, 4 pages.

* cited by examiner

LIGHT EMITTING MATERIAL, LIGHT EMITTING ELEMENT, LIGHT EMITTING DEVICE AND ELECTRONIC DEVICE

TECHNICAL FIELD

The present invention relates to a light emitting material. Further, the present invention relates to light emitting devices and electronic devices having the light emitting element.

BACKGROUND ART

In recent years, thin and flat display devices have been needed as display devices used for televisions, cellular phones, digital cameras, and the like. As the display devices satisfying this need, display devices using self-light emitting elements have attracted attention. One of the self-light emitting elements is a light emitting element utilizing electroluminescence (EL), and this light emitting element includes a light emitting material interposed between a pair of electrodes and can provide emission from the light emitting material by voltage application.

Such a self-light emitting element has advantages over a liquid crystal display element, such as high visibility of the pixels and no need of backlight, and is considered to be suitable as a flat panel display element. Another major advantage of such a light emitting element is that it can be manufactured to be thin and lightweight. In addition, extremely high response speed is also a feature.

Further, such a self-light emitting element can be formed into a film shape; therefore, plane emission can be easily obtained by forming a large-area element. Since this feature is hard to obtain from a point light source typified by an incandescent lamp or an LED or a linear light source typified by a fluorescent lamp, the self-light emitting element has high utility as a plane light source which is applicable to a lighting system or the like.

Light emitting elements utilizing electroluminescence are classified according to whether a light emitting material is an organic compound or an inorganic compound. In general, the former is referred to as an organic EL element, and the latter as an inorganic EL element.

Inorganic EL elements are classified according to their element structures into dispesion-type inorganic EL elements and thin-film inorganic EL elements. They differ in that the former includes a light emitting layer in which particles of a light emitting material are dispersed in a binder, and the latter includes a light emitting layer formed from a thin film of a light emitting material; however, they are share a common feature in that both require electrons accelerated by a high electric field. Note that a mechanism of emission includes a donor-acceptor recombination emission which utilizes a donor level and an acceptor level and a localized emission which utilizes inner-shell electron transition of metal ions. In general, it is often the case that dispersion-type inorganic EL elements employ donor-acceptor recombination emission, and thin-film inorganic EL elements employ localized emission.

Such inorganic EL elements have an advantage of having longer life than organic EL elements. However, they require electrons accelerated by a high electric field for the light emitting layer, so in general it is necessary to apply a voltage of several hundred volts to the light emitting element. For example, a high-luminance blue light emitting inorganic EL element which is necessary for a full-color display has been developed in recent years; however, it requires a drive voltage of 100 V to 200 V (for example, see Reference 1: Japanese Journal of Applied Physics, 1999, Vol. 38, pp. L1291-L1292). Therefore, inorganic EL elements consume a large amount of electric power, so it is difficult to apply them to small and medium-sized displays, for example, to displays of cellular phones or the like.

DISCLOSURE OF INVENTION

In view of the above problem, it is an object of the present invention to provide a novel light emitting material. It is another object to provide a light emitting element which can be driven at low voltage. It is still another object to provide light emitting devices and electronic devices with reduced power consumption.

According to an aspect of the present invention, a light emitting material includes an inorganic compound that is any of a sulfide, a nitride and an oxide, as a base material; at least one element selected from the group consisting of copper, silver, aluminum, fluorine and chorine, as a luminescent material with a luminescent center; manganese; and either gallium phosphide or gallium antimonide.

According to an aspect of the present invention, a light emitting element includes a light emitting layer between a pair of electrodes, and the light emitting layer includes an inorganic compound that is any of a sulfide, a nitride and an oxide, as a base material; at least one element selected from the group consisting of copper, silver, aluminum, fluorine and chorine, as a luminescent material with a luminescent center; manganese; and either gallium phosphide or gallium antimonide.

According to an aspect of the present invention, a light emitting device includes a light emitting element and a control circuit which controls emission of the light emitting element. The light emitting element includes a light emitting layer between a pair of electrodes, and the light emitting layer includes an inorganic compound that is any of a sulfide, a nitride and an oxide, as a base material; at least one element selected from the group consisting of copper, silver, aluminum, fluorine and chorine, as a luminescent material with a luminescent center; manganese; and either gallium phosphide or gallium antimonide.

In the present invention, the inorganic compound is any of zinc sulfide, cadmium sulfide, calcium sulfide, yttrium sulfide, gallium sulfide, strontium sulfide, barium sulfide, zinc oxide, yttrium oxide, aluminum nitride, gallium nitride, and indium nitride.

A light emitting device as referred to in this specification includes image display devices, light emitting devices, and light sources (including lighting systems). Further, the light emitting device also includes all of the following modules: a module in which a connector such as an FPC (flexible printed circuit), a TAB (tape automated bonding) tape, or a TCP (tape carrier package) is attached to a panel provided with light emitting elements; a module having a TAB tape or a TCP provided with a printed wiring board at the end thereof; and a module having an IC (Integrated Circuit) directly mounted on a light emitting device by a COG (Chip On Glass) method.

According to an aspect of the present invention, an electronic device includes a display portion, and the display portion includes a light emitting element and a control circuit which controls emission of the light emitting element. In other words, according to an aspect of the present invention, an electronic device includes a display portion, and the display portion includes a light emitting element and a control circuit which controls emission of the light emitting element, wherein the light emitting element includes a light emitting layer between a pair of electrodes, and the light emitting layer includes a light emitting material comprising an inorganic compound that is any of a sulfide, a nitride and an oxide, as a base material; at least one element selected from the group consisting of copper, silver, aluminum, fluorine and chorine, as a luminescent material with a luminescent center; manganese; and either gallium phosphide or gallium antimonide.

A light emitting material of the present invention has high electric conductivity and low resistance.

In addition, a light emitting element of the present invention can be driven at low voltage.

Further, since light emitting devices and electronic devices of the present invention include light emitting elements which can be driven at low voltage, power consumption can be reduced. In addition, a driver circuit which can withstand high voltage is not necessary and thus, a light emitting device can be manufactured at low cost.

BEST MODE FOR CARRYING OUT INVENTION

Figure 1:
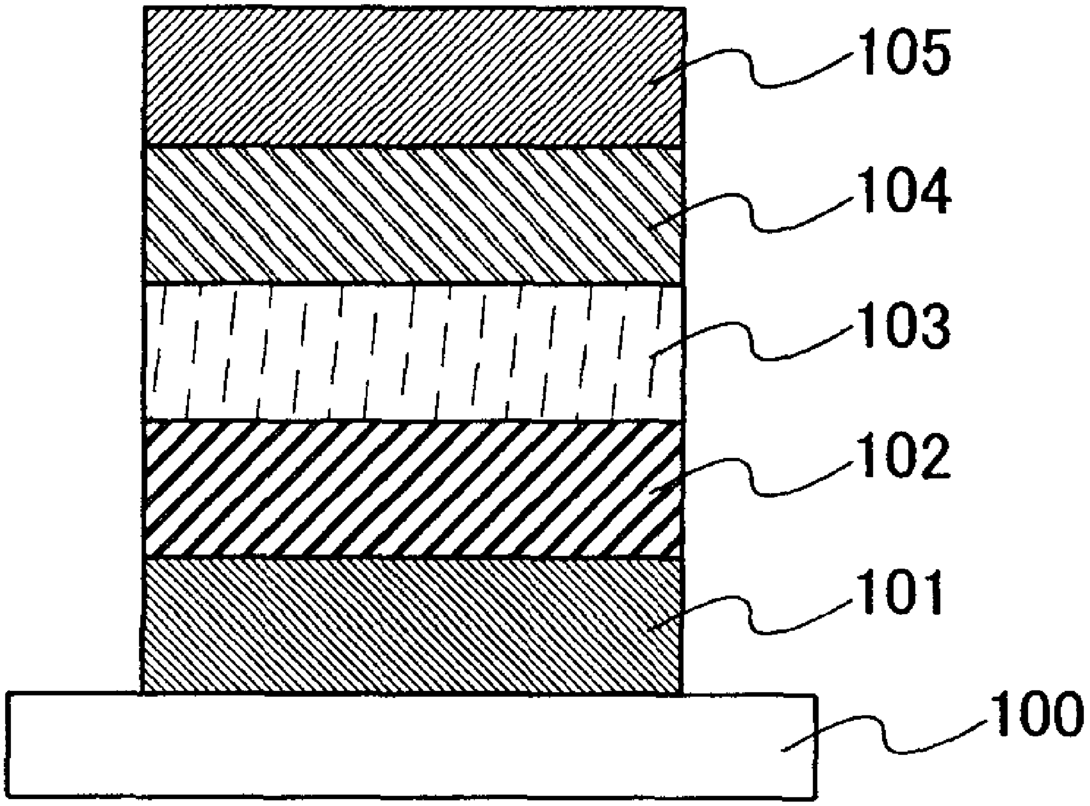
FIG. 1 shows a light emitting element according to an aspect of the present invention.

Hereinafter, embodiment modes of the present invention are explained in detail with reference to the accompanying drawings. However, the present invention is not limited to the following description. It will be apparent to those skilled in the art that various changes can be made to the modes and details of the present invention without departing from the spirit and the scope of the present invention. Thus, the present invention should not be interpreted as being limited to the following description of the embodiment modes.

EMBODIMENT MODE 1

Embodiment Mode 1 will describe a light emitting material according to the present invention. The light emitting material of the present invention includes a base material, a luminescent material with a donor-acceptor recombination-type luminescent center, manganese (Mn), and either gallium phosphide (GaP) or gallium antimonide (GaSb).

As the base material used for the light emitting material, a sulfide, an oxide, or a nitride can be used. As a sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As an oxide, for example, zinc oxide (ZnO), yttrium oxide ($Y_2O_3$), or the like can be used. Further, as a nitride, for example, aluminum nitride (AlN), gallium nitride (GaN), indium nitride (InN), or the like can be used. Moreover, zinc selenide (ZnSe), zinc telluride (ZnTe), or the like can also be used, and a ternary mixed crystal such as calcium-gallium sulfide ($CaGa_2S_4$), strontium-gallium sulfide ($SrGa_2S_4$), or barium-gallium sulfide ($BaGa_2S_4$) may also be used.

The luminescent material with a donor-acceptor recombination-type luminescent center included in the light emitting material includes a first impurity element which forms a donor level and a second impurity element which forms an acceptor level. For example, as the first impurity element, fluorine (F), chlorine (Cl), aluminum (Al), or the like can be used. As the second impurity element, for example, copper (Cu), silver (Ag), or the like can be used. Note that there may be a case where a lattice defect or the like forms a donor level, and thus, the first impurity element is not necessarily used.

As a synthesis method of a light emitting material, various methods such as a solid-phase method or a liquid-phase method (for example, a coprecipitation method) can be used. A liquid-phase method such as a spray pyrolysis method, a double decomposition method, a method employing a pyrolytic reaction of a precursor, a reverse micelle method, a method in which one or more of the above methods and high-temperature baking are combined, or a freeze-drying method can be used.

In the solid-phase method, synthesis is conducted by a solid phase reaction. A base material and an element to be included in the base material or a compound including the element are weighed, mixed in a mortar, then heated and baked in an electric furnace. The baking temperature is preferably 700 to 1500° C. This is because if the temperature is too low, the solid phase reaction will not progress, while if the temperature is too high, the base material will decompose. Baking may be conducted with the mixture in powdered form; however, it is preferable to conduct baking with the mixture in pellet form. Compared to other methods, such as a liquid-phase method, this method requires baking to be conducted at a higher temperature. However, this method is simple, and therefore gives high productivity and is suitable for mass production.

In the liquid-phase method (for example, a coprecipitation method), a base material or a compound including a base material and an element to be included in the base material or a compound including the element are reacted with each other in a solution and dried, then baked. In this method, since particles of the light emitting material are uniformly dispersed and the particles each have a small diameter, the synthesis reaction can progress at an even lower baking temperature than that of the solid-phase method.

A method for synthesizing a light emitting material of the present invention by a solid-phase method will now be described. A base material and an element constituting a luminescent material with a donor-acceptor recombination-type luminescent center or a compound including the element, and manganese (Mn) are weighed, mixed in a mortar, then baked by being heated in an electric furnace. As the base material, the above described base materials can be used. In the luminescent material with a donor-acceptor recombination-type luminescent center, as a first impurity element, for example, fluorine (F), chlorine (Cl), or the like can be used; as a compound containing a first impurity element, for example, aluminum sulfide ($Al_2S_3$) or the like can be used; as a second impurity element, for example, copper (Cu), silver (Ag), or the like can be used; and as a compound containing a second impurity element, for example, copper sulfide ($Cu_2S$), silver sulfide ($Ag_2S$), or the like can be used. The baking temperature is preferably 700 to 1500° C. Further, baking may be performed after the mixture is heated in a sealed evacuated tube. Furthermore, baking may be conducted while flowing a gas containing an element constituting a base material. When ZnS is used as the base material, hydrogen sulfide ($H_2S$) gas is preferably used. Note that baking is preferably conducted with the mixture in pellet form rather than in powdered form.

Further, when a solid-phase reaction is employed, a compound including the first impurity element and the second impurity element may also be used. In this case, the impurity elements are easily diffused, so the solid-phase reaction proceeds readily, and thus a uniform light emitting material can be obtained. Further, since an unnecessary impurity element does not enter, a light emitting material with high purity can be obtained. As the compound including the first impurity element and the second impurity element, for example, copper chloride (CuCl), silver chloride (AgCl), or the like can be used.

Note that the concentration of these impurity elements may be 0.01 to 10 atomic % with respect to the base material, and is preferably 0.05 to 5 atomic %.

Meanwhile, Mn is added using elemental Mn or a manganese sulfide (MnS) compound. The concentration of Mn may be 0.01 to 50 atomic % with respect to the base material, and is preferably 0.05 to 30 atomic %.

Next, weighed gallium phosphide (GaP) or gallium antimonide (GaSb) is mixed into the baked material. Then, baking is conducted again by heating using an electric furnace. The baking temperature is preferably 300 to 1000° C. Further, the concentration of each GaP and GaSb with respect to the base material may be 0.01 to 50 atomic %, and is preferably 0.05 to 30 atomic %.

The thus obtained light emitting material has high electric conductivity and low resistance.

This embodiment mode can be combined with any of the other embodiment modes as appropriate.

EMBODIMENT MODE 2

Embodiment Mode 2 will describe a thin-film type light emitting element according to the present invention with reference to FIG. 1.

The light emitting element described in this embodiment mode has an element structure including, over a substrate 100, a first electrode 101 and a second electrode 105, a first insulating layer 102 and a second insulating layer 104 in contact with the electrodes, and a light emitting layer 103 between the first insulating layer 102 and the second insulating layer 104. The light emitting element described in this embodiment mode emits light from the light emitting layer 103 by voltage application between the first electrode 101 and the second electrode 105 and can be operated by either DC drive or AC drive.

The substrate 100 is used as a support of the light emitting element. For the substrate 100, glass, plastic, or the like can be used, for example. Note that another material may be used as long as it functions as a support during a manufacturing process of the light emitting element.

The first electrode 101 and the second electrode 105 can be formed using a metal, an alloy, a conductive compound, a mixture thereof, or the like. Note that it is necessary that one or both of the first electrode 101 and the second electrode 102 are transparent in order to obtain plane emission. Specifically, an example of the transparent electrode is indium tin oxide (ITO), indium tin oxide containing silicon or silicon oxide (ITSO), indium zinc oxide (IZO), indium oxide containing tungsten oxide and zinc oxide (IWZO), or the like. Films including these conductive metal oxides are generally formed by sputtering. For example, a film of indium zinc oxide (IZO) can be formed by sputtering using a target in which 1 wt % to 20 wt % zinc oxide is added to indium oxide. A film of indium oxide containing tungsten oxide and zinc oxide (IWZO) can be formed by sputtering using a target containing 0.5 wt % to 5 wt % tungsten oxide and 0.1 wt % to 1 wt % zinc oxide with respect to indium oxide. Alternatively, aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), or a nitride of a metal material (for example, titanium nitride (TiN)) can be used as a metal electrode. Note that in the case where the metal electrode is formed to have a light transmitting property, a material with low visible light transmittance can also be used as a light transmitting electrode when formed with a thickness of approximately 1 nm to 50 nm, and is preferably approximately 5 nm to 20 nm. Note that the electrode can be formed by vacuum evaporation, CVD, or a sol-gel method other than sputtering.

The light emitting layer 103 is a layer including the light emitting material described in Embodiment Mode 1, which can be formed by a vacuum evaporation method such as a resistance heating evaporation method or an electron beam (EB) evaporation method, a sputtering method, a metal organic CVD method or a low-pressure hydride transport CVD method, an atomic layer epitaxy (ALE) method, or the like. Although there is no particular limitation on the thickness, it is preferably in the range of 10 nm to 1000 nm.

There are no particular limitations on the first insulating layer 102 and the second insulating layer 104, but they preferably have high dielectric strength and dense film quality. Furthermore, they preferably have a high dielectric constant. For example, a film of yttrium oxide ($Y_2O_3$), titanium oxide ($TiO_2$), aluminum oxide ($Al_2O_3$), hafnium oxide ($HfO_2$), tantalum oxide ($Ta_2O_5$), silicon oxide ($SiO_2$), barium titanate ($BaTiO_3$), strontium titanate ($SrTiO_3$), lead titanate ($PbTiO_3$), silicon nitride ($Si_3N_4$), zirconium oxide ($ZrO_2$), or the like, a mixed film thereof, or a stacked film of two or more kinds can be used. These insulating films can be formed by sputtering, evaporation, CVD, or the like. Although there is no particular limitation on the thickness, it is preferably in the range of 10 nm to 1000 nm. In the case of low voltage driving, the light emitting element preferably has a thickness of 500 nm or less, and is more preferably 100 nm or less.

Since a highly electrically conductive light emitting material is used in the light emitting element of the present invention, a light emitting element which can be driven at low voltage can be obtained. Further, the light emitting material can emit light at a low driving voltage, and thus, a light emitting element with low power consumption can be provided.

This embodiment mode can be combined with any of the other embodiment modes as appropriate.

EMBODIMENT MODE 3

Figure 2:
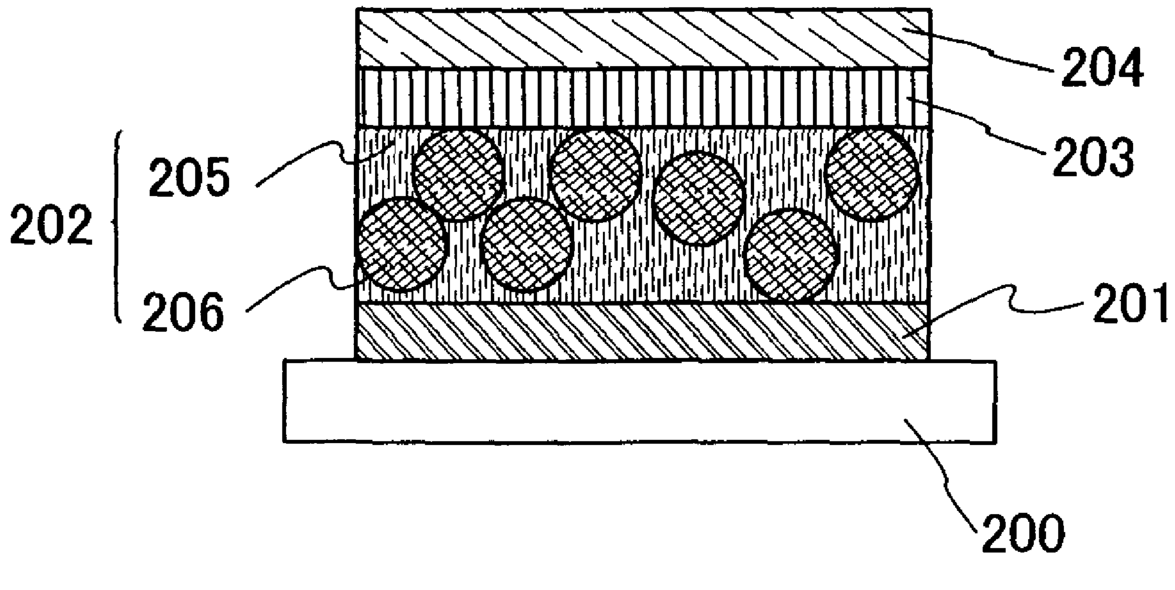
FIG. 2 shows a light emitting element according to an aspect of the present invention.

Embodiment Mode 3 will describe a dispersion type light emitting element according to the present invention with reference to FIG. 2.

The light emitting element shown in this embodiment mode has an element structure in which a first electrode 201, a second electrode 204, an insulating layer 203 in contact with the second electrode, and a light emitting layer 202 between the first electrode 201 and the insulating layer 203 are provided over a substrate 200. The light emitting element described in this embodiment mode emits light from the light emitting layer 202 by voltage application between the first electrode 201 and the second electrode 204 and can be operated by either DC drive or AC drive.

The light emitting layer 202 is a film in which particles of the light emitting material 205 are dispersed in a binder 206. The binder is a substance used for fixing the particles of the light emitting material in a dispersed state and for keeping a shape as a light emitting layer. The light emitting material is evenly dispersed and fixed in the light emitting layer by the binder. In the case where particles having a desired size cannot be obtained depending on a manufacturing method of the light emitting material, the light emitting material is pounded in a mortar so as to form particles having a desired size.

As a formation method of the light emitting layer, a droplet-discharging method which can selectively form a light emitting layer, a printing method such as screen printing or offset printing, a coating method such as spin coating, a dipping method, a dispenser method or the like can be used. There are no particular limitations on the film thickness; however, a film thickness in the range of 10 to 1000 nm is preferable. In the light emitting layer including the light emitting material and the binder, the ratio of the light emitting material is preferable greater than or equal to 50 wt % and less than or equal to 80 wt %.

As the binder used in this embodiment mode, an organic material or an inorganic material can be used, and further, a mixed material of an organic material and an inorganic material can be used. As an organic material, the following resin material can be used: a polymer having a comparatively high dielectric constant such as a cyanoethyl cellulose based resin, polyethylene, polypropylene, a polystyrene based resin, a silicone resin, an epoxy resin, vinylidene fluoride, or the like. In addition, a heat-resistant high-molecular material such as aromatic polyamide or polybenzimidazole, or a siloxane resin may also be used. The siloxane resin is a resin including a Si—O—Si bond. Further, the following resin material may also be used: a vinyl resin such as polyvinyl alcohol or polyvinylbutyral, a phenol resin, a novolac resin, an acrylic resin, a melamine resin, a urethane resin, an oxazole resin (polybenzoxazole), or the like. On the other hand, the inorganic material contained in the binder can be formed with a material of silicon oxide ($SiO_x$), silicone nitride ($SiN_x$), silicon containing oxygen and nitrogen, aluminum nitride (AlN), aluminum containing oxygen and nitrogen or aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS and other substances containing an inorganic insulating material. By mixing an organic material with an inorganic material having a high dielectric constant (by adding or the like), a dielectric constant of an electroluminescent layer including a light emitting material and a binder can be further controlled and the dielectric constant can be further increased.

In the formation process of the light emitting layer 202, the light emitting material is dispersed in a solution including a binder. As a solvent for the solution containing a binder that can be used in this embodiment mode, a solvent capable of forming a solution having a viscosity such that it can dissolve a binder material and is suitable for a method for forming a light emitting layer (various wet processes) and a desired film thickness, may be appropriately selected. An organic solvent or the like can be used, and when, for example, a siloxane resin is used as a binder, propylene glycol monomethyl ether, propylene glycol monomethyl ether acetate (also referred to as PGMEA), 3-methoxy-3-methyl-1-butanol (also referred to as MMB), or the like can be used as the organic solvent.

There is no particular limitation on the insulating layer 203 in FIG. 2; however, the insulating layer 203 preferably has a high dielectric strength, dense film quality, and further, a high dielectric constant. For example, yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), silicon oxide ($SiO_2$), or the like, a mixed film thereof, or a stacked film containing two or more kinds of the above materials can be used. These insulating films can be formed by sputtering, evaporation, CVD, or the like. In addition, particles of these insulating materials may be dispersed in a binder to form the insulating layer 203. The binder material for forming the insulating layer can be formed by using the same materials and methods as those of the binder contained in the light emitting layer. There is no particular limitation on the film thickness, but it is preferably in the range of 10 to 1000 nm.

Since a highly electrically conductive light emitting material is used in the light emitting element of the present invention, a light emitting element which can be driven at low voltage can be obtained. Further, the light emitting material can emit light at a low driving voltage, and thus, a light emitting element with low power consumption can be provided.

This embodiment mode can be combined with any of the other embodiment modes as appropriate.

EMBODIMENT MODE 4

Embodiment Mode 4 will describe a mode of a light emitting element with a structure in which a plurality of light emitting units of the present invention are stacked (hereinafter referred to as a stacked element) with reference to FIG. 3. This light emitting element has a plurality of light emitting units between a first electrode and a second electrode.

Figure 3:
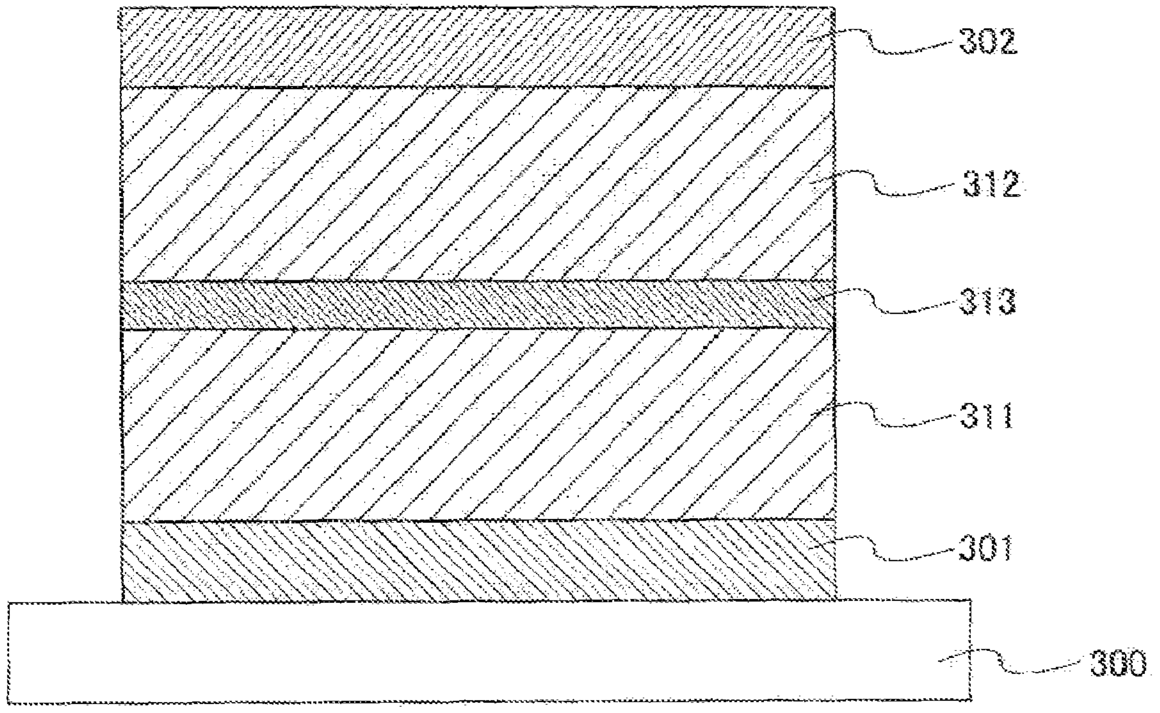
FIG. 3 shows a light emitting element according to an aspect of the present invention.

In FIG. 3, a first light emitting unit 311 and a second light emitting unit 312 are stacked between a first electrode 301 and a second electrode 302. Materials similar to those in Embodiment Modes 2 and 3 can be applied to the first electrode 301 and the second electrode 302. Furthermore, the first light emitting unit 311 and the second light emitting unit 312 have the same structure, which is similar to the structures described in Embodiment Modes 2 and 3.

A charge generation layer 313 contains a complex of an organic compound and a metal oxide. The complex of an organic compound and a metal oxide is formed from an organic compound and a metal oxide such as $V_2O_5$, $MoO_3$, or $WO_3$. As the organic compound, various compounds such as an aromatic amine compound, a carbazole derivative, aromatic hydrocarbon, and a high molecular compound (oligomer, dendrimer, polymer, or the like) can be used. It is to be noted that the organic compound having hole mobility of $10^{-6}$ $cm^2/Vs$ or higher is preferably used as a hole transporting organic compound. However, other than the above materials may be used as long as the material has a higher hole transporting property than an electron transporting property. Since the complex of an organic compound and a metal oxide is excellent in carrier injecting property and carrier transporting property, it can realize low voltage drive and low current drive.

The charge generation layer 313 may be formed using a combination of the complex of an organic compound and a metal oxide, with another material. For example, a layer containing the complex of an organic compound and a metal oxide, and a layer containing a compound selected from electron donating materials and a compound having a high electron transporting property may be combined to form the charge generation layer 313. Alternatively, a layer containing the complex of an organic compound and a metal oxide, and a transparent conductive film may be combined to form the charge generation layer 313.

In any case, it is preferable that the charge generation layer 313 interposed between the first light emitting unit 311 and the second light emitting unit 312 injects electrons to the light emitting unit on one side and injects holes to the light emitting unit on the other side when a voltage is applied to the first electrode 301 and the second electrode 302.

Although the light emitting element having two light emitting units is described in this embodiment mode, a light emitting element in which three or more light emitting units are stacked can also be employed. Arrangement of a plurality of light emitting units, which are partitioned by an electrically insulating charge generation layer between a pair of electrodes, as in the light emitting element of this embodiment mode, can realize an element having the long life in a high luminance region, while keeping a current density low. In addition, in the case where the light emitting element is applied to a lighting system, for example, uniform emission in a large area is possible because voltage drop due to resistance of an electrode material can be suppressed. Furthermore, in the case where the light emitting element is applied to a display device, a display device with a high contrast which can be driven at a low voltage and consumes less power can be realized.

This embodiment mode can be combined with any of the other embodiment modes as appropriate.

EMBODIMENT MODE 5

Embodiment Mode 5 will describe a display device as one mode of the light emitting device with reference to FIGS. 4 to 8.

Figure 4:
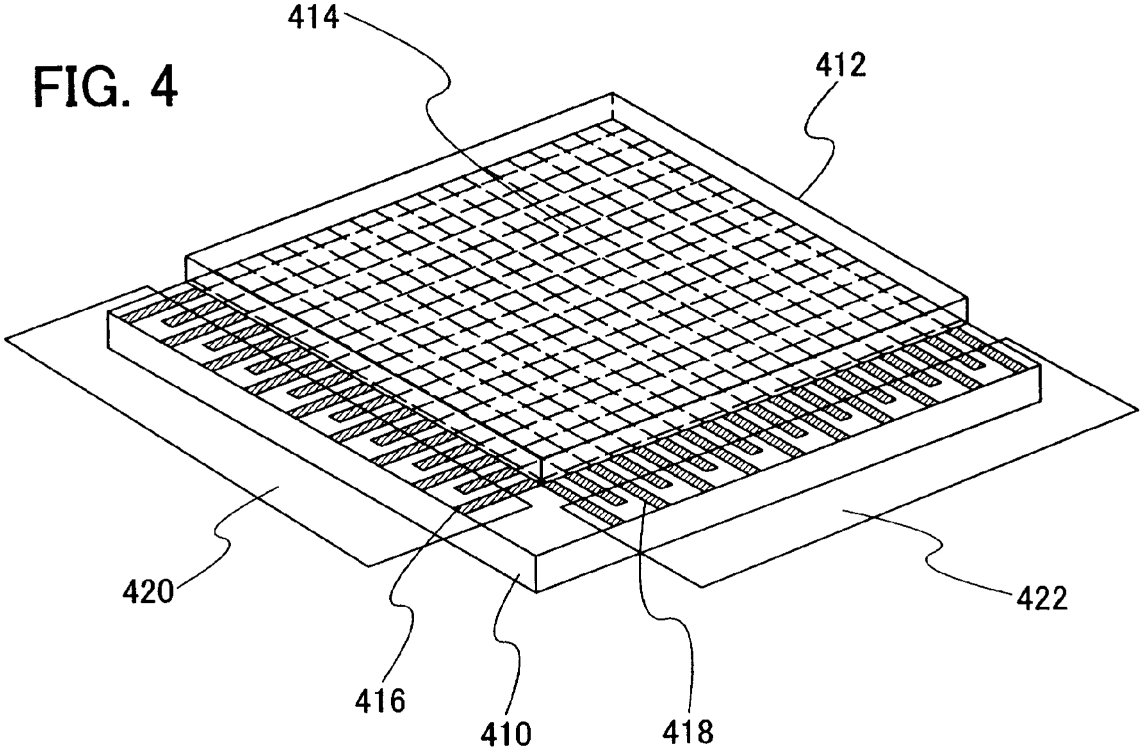
FIG. 4 shows a light emitting device according to an aspect of the present invention.

FIG. 4 is a schematic configuration diagram showing a main part of the display device. Over a substrate 410, a first electrode 416 and a second electrode 418 that extends in a direction intersecting with the first electrode 416 are provided. A light emitting layer similar to those described in Embodiment Modes 1 and 2 is provided at least at the intersection portion of the first electrode 416 and the second electrode 418, and thus, a light emitting element is formed. In a light emitting device of FIG. 4, a plurality of first electrodes 416 and a plurality of second electrodes 418 are disposed and light emitting elements of pixels are arranged in a matrix, thus, a display portion 414 is formed. In the display portion 414, emission and non-emission of each light emitting element are controlled by controlling potentials of the first electrode 416 and the second electrode 418. In this manner, the display portion 414 can display moving images and still images.

In this light emitting device, a signal for displaying an image is applied to each of the first electrode 416 extending in one direction over the substrate 410 and the second electrode 418 that intersects with the first electrode 416, and thus, emission or non-emission of a light emitting element is selected. In other words, this is a simple matrix display device of which pixels are driven solely by a signal given from an external circuit. A display device like this has a simple structure and can be manufactured easily even when the area is enlarged.

In the above, when the first electrode 416 is formed from aluminum, titanium, tantalum or the like, and the second electrode 418 is formed from indium oxide, indium tin oxide (ITO), indium zinc oxide, or zinc oxide, a display device having the display portion 414 on the counter substrate 412 side can be obtained. In this case, when a thin oxide film is formed over a surface of the first electrode 416, a barrier layer is formed and luminous efficiency can be improved because of a carrier blocking effect. When the first electrode 416 is formed from indium oxide, indium tin oxide (ITO), indium zinc oxide, or zinc oxide, and the second electrode 418 is formed from aluminum, titanium, tantalum or the like, a display device having the display portion 414 on the substrate 410 side can be provided. Furthermore, when both the first electrode 416 and the second electrode 418 are formed from transparent electrodes, a dual emission display device can be provided.

A counter substrate 412 may be provided as necessary, and it can serve as a protective member when provided adjusting to the position of the display portion 414. Even if a hard plate member is not used, a resin film or a resin material can be applied instead. The first electrode 416 and the second electrode 418 are led to end portions of the substrate 410 to form terminals to be connected to external circuits. In other words, the first electrode 416 and the second electrode 418 are in contract with flexible wiring boards 420 and 422 at the end portions of the substrate 410. As the external circuits, there are a power supply circuit, a tuner circuit, and the like, in addition to a controller circuit that controls a video signal.

Figure 5:
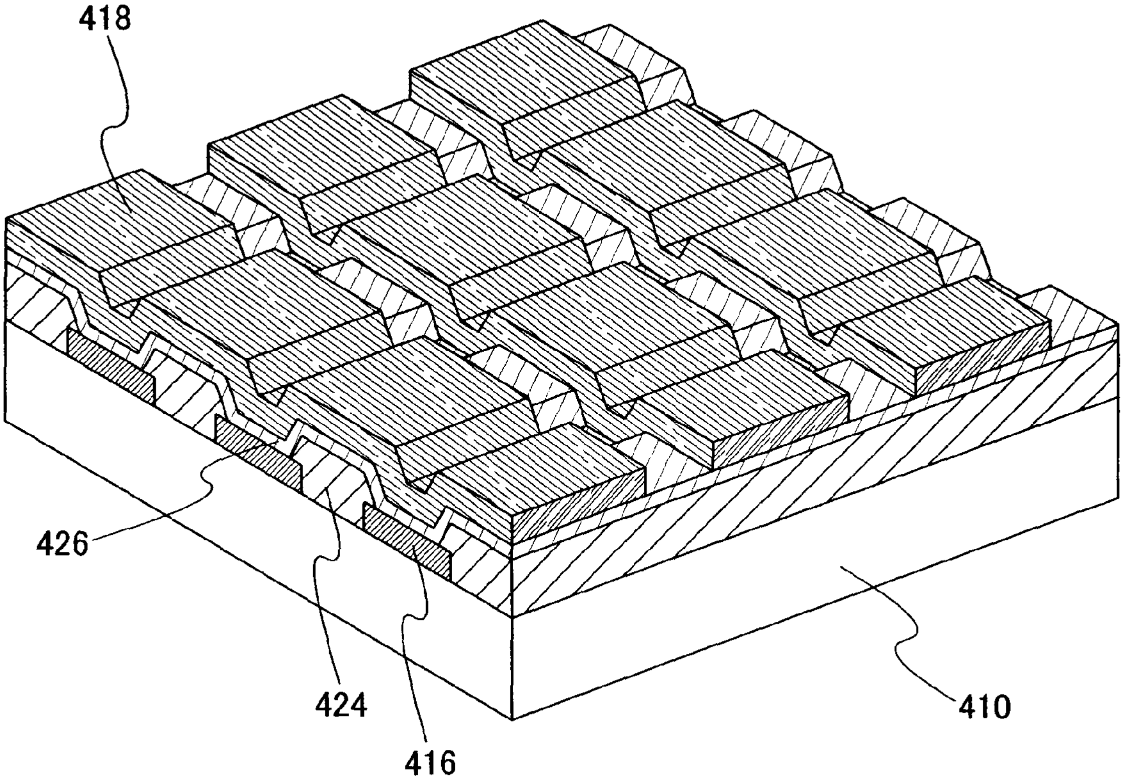
FIG. 5 shows a light emitting device according to an aspect of the present invention.

FIG. 5 is a partial enlarged view showing a structure of the display portion 414. A partition layer 424 is formed on a side end portion of the first electrode 416 formed over the substrate 410. An EL layer 426 is formed at least over an exposed surface of the first electrode 416. The second electrode 418 is formed over the EL layer 426. The second electrode 418 intersects with the first electrode 416, so that it extends over the partition layer 424 as well. The partition layer 424 is formed using an insulating material so that a short circuit between the first electrode 416 and the second electrode 418 does not occur In a portion where the partition layer 424 covers the end portion of the first electrode 416, a side end portion of the partition layer 424 is sloped so as not to form a steep step, such that it has a so-called tapered shape. When the partition layer 424 has such a shape, coverage of the EL layer 426 and the second electrode 418 improves, and defects such as cracks or tear can be prevented.

Figure 6:
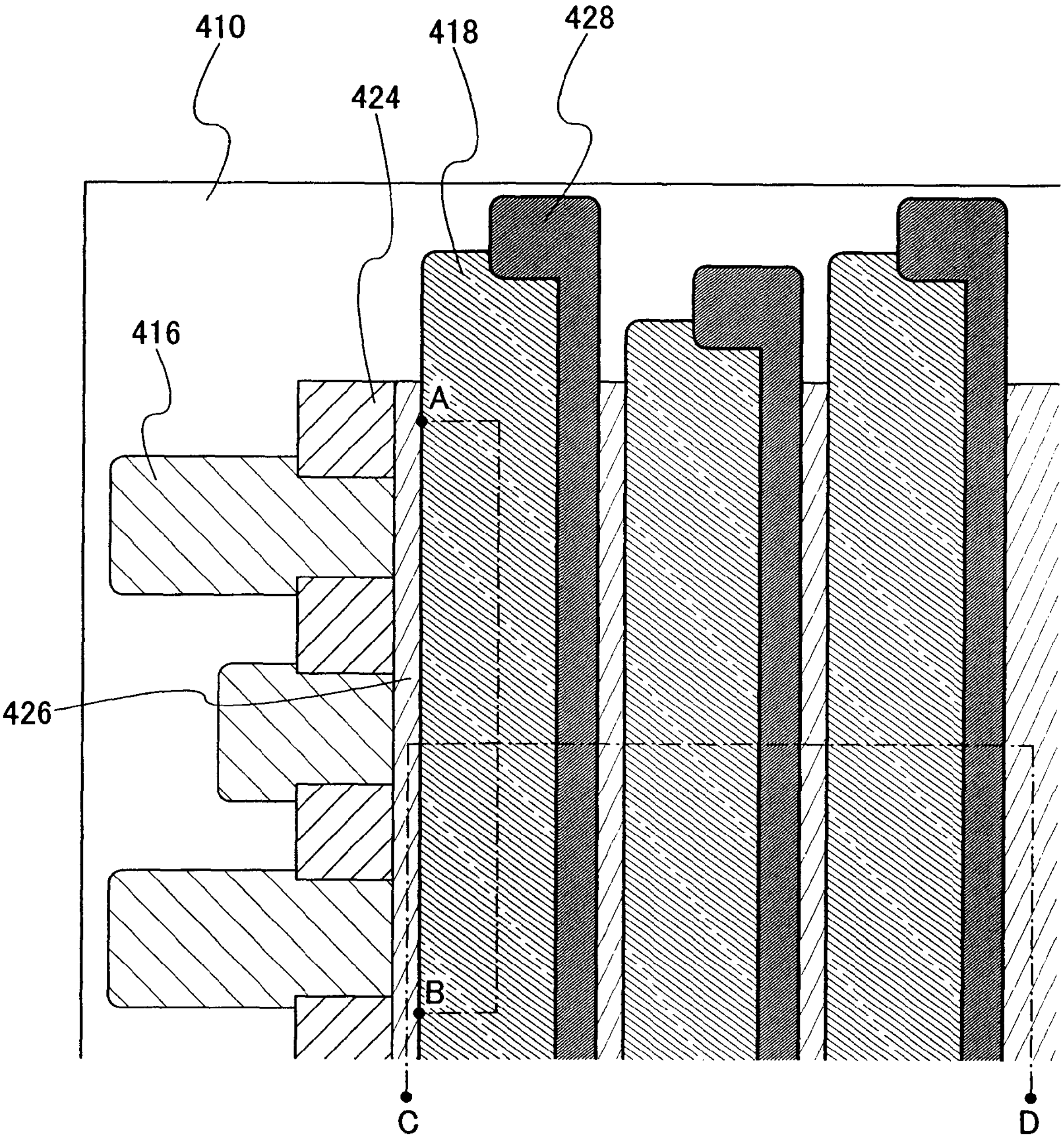
FIG. 6 shows a light emitting device according to an aspect of the present invention.

FIG. 6 is a plane view of the display portion 414, which shows the arrangement of the first electrode 416, the second electrode 418, the partition layer 424, and the EL layer 426. In the case where the second electrode 418 is formed of a transparent conductive film of an oxide such as indium tin oxide or zinc oxide, an auxiliary electrode 428 is preferably provided so as to reduce the resistance loss. In this case, the auxiliary electrode 428 may be formed using a refractory metal such as titanium, tungsten, chromium, or tantalum, or a combination of the refractory metal and a low resistance metal such as aluminum or silver.

Figure 7A:
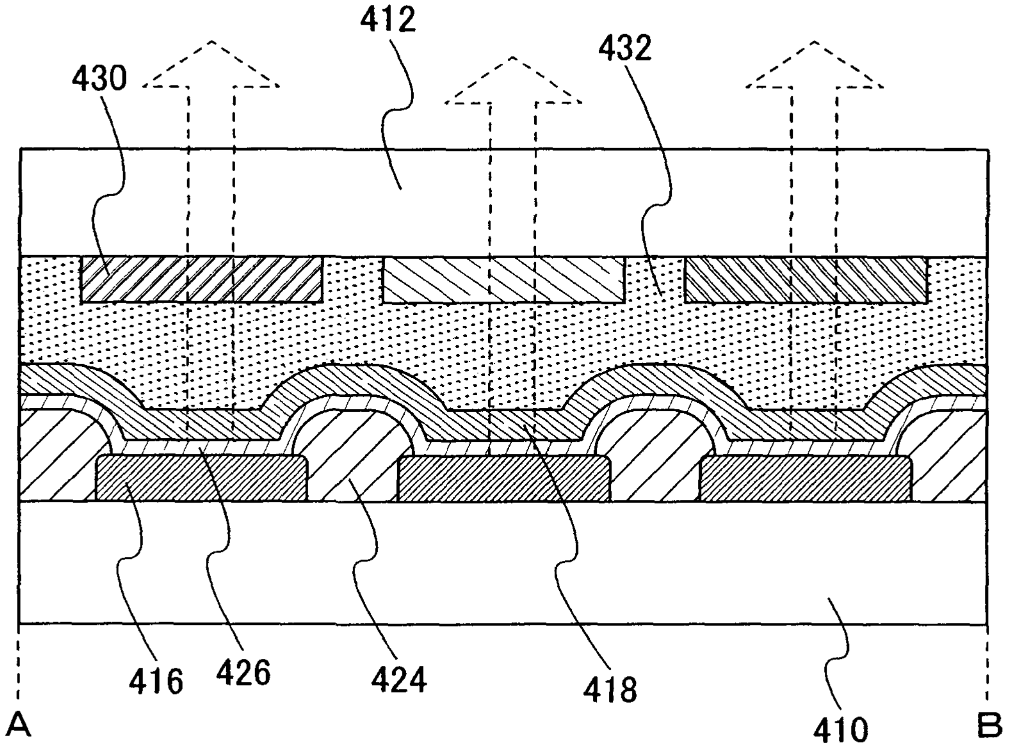
FIGS. 7A and 7B each show a light emitting device according to an aspect of the present invention.
Figure 7B:
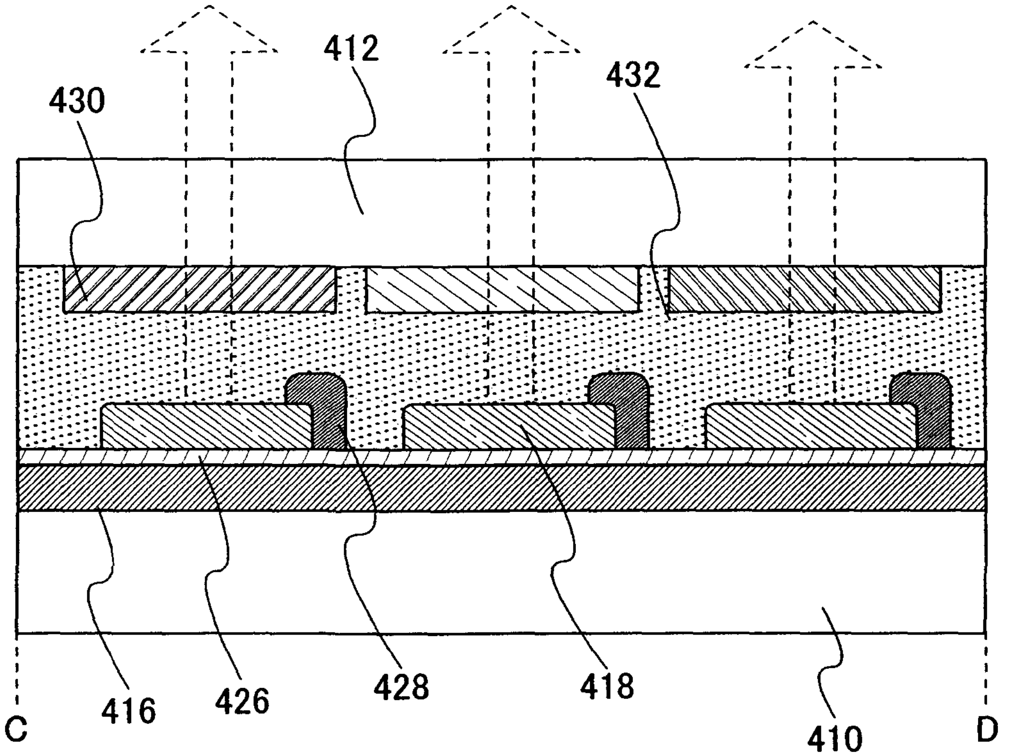

FIGS. 7A and 7B show cross-sectional views taken along the line A-B and the line C-D in FIG. 6, respectively. FIG. 7A is a cross-sectional view in which the first electrodes 416 are lined up, and FIG. 7B is a cross-sectional view in which the second electrodes 418 are lined up. The EL layer 426 is formed at the intersection portions of the first electrode 416 and the second electrode 418, and light emitting elements are formed in these portions. The auxiliary electrode 428 shown in FIG. 7B is provided over the partition layer 424 and in contact with the second electrode 418. The auxiliary electrode 428 formed over the partition layer 424 does not block light from the light emitting element formed at the intersection portion of the first electrode 416 and the second electrode 418; therefore, the emitted light can be efficiently utilized. In addition, with this structure, a short circuit between the auxiliary electrode 428 and the first electrode 416 can be prevented.

In FIGS. 7A and 7B, examples in which color conversion layers 430 are provided for the counter substrate 412 are shown. The color conversion layer 430 converts the wavelength of light emitted from the EL layer 426 so as to change the color of the emitted light. In this case, light emitted from the EL layer 426 is preferably blue light or ultraviolet light with high energy. When the color conversion layers 430 for converting light to red, green, and blue light are arranged, a display device that performs RGB full-color display can be obtained. Furthermore, the color conversion layer 430 can be replaced by a colored layer (color filter). In this case, the EL layer 426 may be made to emit white light. A filler 432 may be provided as appropriate to fix the substrate 410 and the counter substrate 412 to each other.

Figure 8:
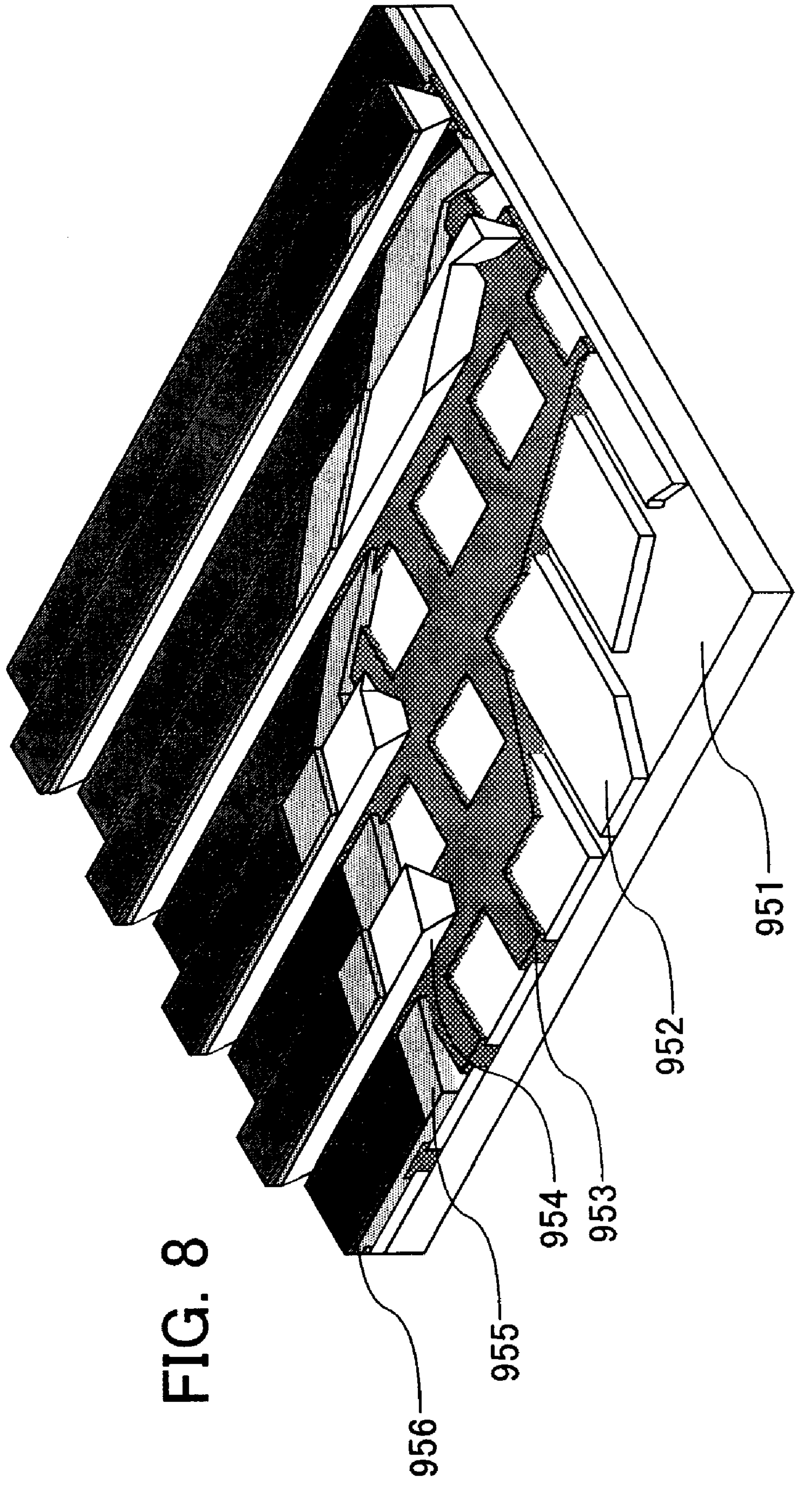
FIG. 8 shows a light emitting device according to an aspect of the present invention.

Another structure of the display portion 414 is shown in FIG. 8. In the structure shown in FIG. 8, an end portion of a first electrode 952 is covered by an insulating layer 953. In addition, a partition layer 954 is provided over the insulating layer 953. Sidewalls of the partition layer 954 have a slant such that a distance between one sidewall and the other sidewall becomes narrower as the sidewalls gets closer to the substrate surface. In other words, a cross-section taken along the direction of a shorter side of the partition layer 954 has a trapezoidal shape, and the base of the trapezoid (a side of the trapezoid that is parallel to the surface of the insulating layer 953 and is in contact with the insulating layer 953) is shorter than the upper side of the trapezoid (a side of the trapezoid that is parallel to the surface of the insulating layer 953 and is not in contact with the insulating layer 953). By providing the partition layer 954 in this manner, an EL layer 955 and a second electrode 956 can be formed in a self-aligning manner utilizing the partition layer 954.

Since the light emitting element in the display device of this embodiment mode emits light at low voltage, a booster circuit or the like is not required; therefore, the structure of the device can be simplified.

EMBODIMENT MODE 6

Figure 9A:
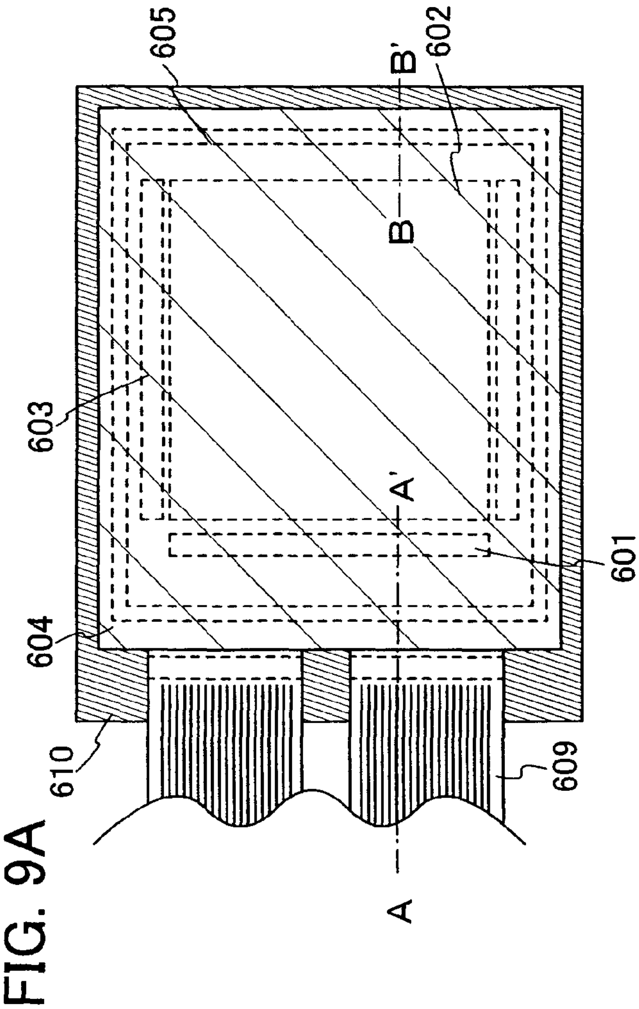
FIGS. 9A and 9B show a light emitting device according to an aspect of the present invention.
Figure 9B:
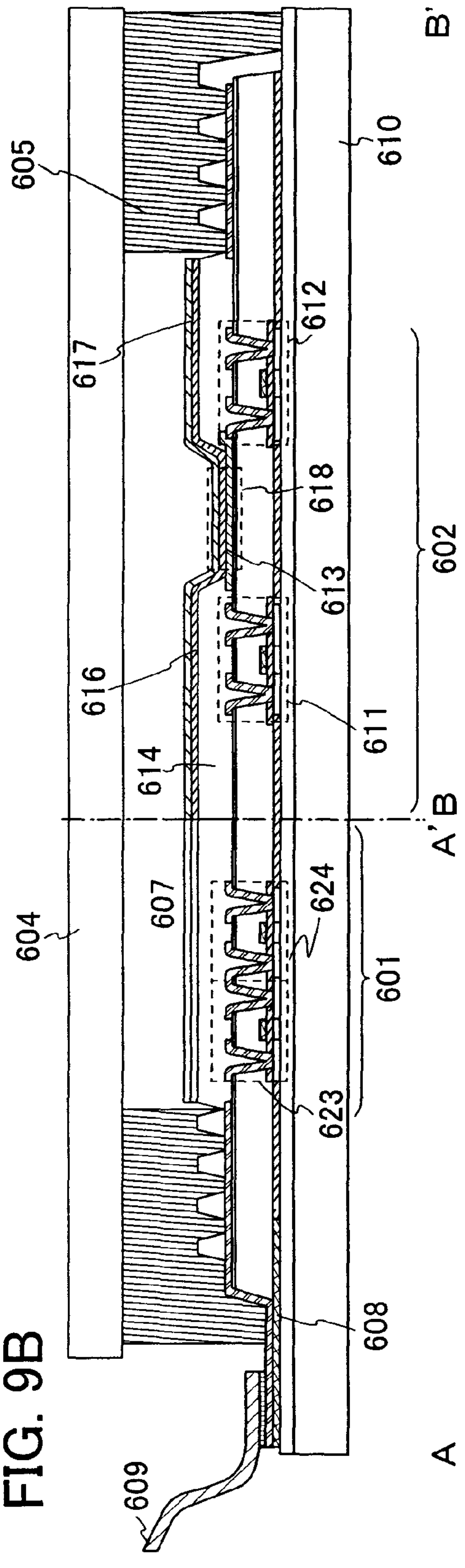

Embodiment Mode 6 will describe an active light emitting device in which the drive of a light emitting element is controlled by a transistor. In this embodiment mode, a light emitting device including the light emitting element manufactured by applying the invention in a pixel portion will be described with reference to FIGS. 9A and 9B. Note that FIG. 9A is a top view showing the light emitting device and FIG. 9B is a cross-sectional view taken along lines A-A' and B-B' of FIG. 9A. In FIGS. 9A and 9B, concerning the reference numerals for the areas shown by dotted lines, 601 denotes a driver circuit portion (a source side driver circuit); 602, a pixel portion; and 603, a driver circuit portion (a gate side driver circuit). Further, reference numeral 604 denotes a sealing substrate; 605, a sealant; and 607, a space surrounded by the sealant 605.

Note that a lead wiring 608 is a wiring for transmitting signals to be inputted to the source side driver circuit 601 and the gate side driver circuit 603 and receives a video signal, a clock signal, a start signal, a reset signal, or the like from an FPC (flexible printed circuit) 609 that serves as an external input terminal. Note that only the FPC is shown here; however, the FPC may be provided with a printed wiring board (PWB). The light emitting device in this specification includes not only a main body of the light emitting device but also the light emitting device with an FPC or a PWB attached.

Next, a cross-sectional structure is explained with reference to FIG. 9B. The driver circuit portion and the pixel portion are formed over an element substrate 610. Here, the source side driver circuit 601 that is the driver circuit portion and one pixel in the pixel portion 602 are shown.

Note that a CMOS circuit that is a combination of an n-channel TFT (also referred to as a thin film transistor) 623 and a p-channel TFT 624 is formed as the source side driver circuit 601. The driver circuit may be a CMOS circuit, a PMOS circuit, or an NMOS circuit. A driver-integrated type structure in which a driver circuit is formed over the same substrate is described in this embodiment mode, but the driver-integrated type structure is not necessarily required. A driver circuit can be formed external to the substrate, rather than over the substrate. Note that there is no particular restriction on the structure of the TFT. A staggered TFT or an inversely staggered TFT may be used for example. Further, there is no particular restriction on the crystallinity of a semiconductor film used in the TFT. An amorphous semiconductor film may be used, or a crystalline semiconductor film may be used. Furthermore, there is no particular restriction on a semiconductor material used. An inorganic compound may be used, or an organic compound may be used.

The pixel portion 602 includes a plurality of pixels, each of which includes a switching TFT 611, a current control TFT 612, and a first electrode 613 which is electrically connected to a drain of the current control TFT 612. Note that an insulator 614 is formed to cover an end portion of the first electrode 613. Here, a positive type photosensitive acrylic resin film is used.

The insulator 614 is formed to have a curved surface with curvature at an upper end portion or a lower end portion thereof in order to obtain favorable coverage. For example, in the case of using positive type photosensitive acrylic resin as a material of the insulator 614, the insulator 614 is preferably formed to have a curved surface with a curvature radius (0.2 μm to 3 μm) only at an upper end portion. Either a negative type which becomes insoluble in an etchant by light irradiation or a positive type which becomes soluble in an etchant by light irradiation can be used as the insulator 614.

An EL layer 616 and a second electrode 617 are formed over the first electrode 613. At least one of the first electrode 613 and the second electrode 617 has a light transmitting property, through which light emitted from the EL layer 616 can be taken out to the outside.

The EL layer 616 includes any one of the light emitting layers described in Embodiment Modes 2 to 4.

Note that the first electrode 613, the EL layer 616, and the second electrode 617 can be formed by various methods. Specifically, they can be formed by a vacuum evaporation method such as a resistance heating evaporation method or an electron beam (EB) evaporation method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like. Further, an inkjet method, a spin coating method, or the like can be used. In addition, a different film formation method may be employed to form each electrode or layer.

By attaching the sealing substrate 604 to the element substrate 610 with the sealant 605, a light emitting element 618 is provided in the space 607 surrounded by the element substrate 610, the sealing substrate 604, and the sealant 605. Note that the space 607 is filled with a filler. There are cases where the space 607 may be filled with an inert gas (such as nitrogen or argon) as such a filler, or where the space 607 may be filled with the sealant 605.

Note that an epoxy-based resin is preferably used as the sealant 605. Further, it is desirable that materials used for the sealant and the filler are materials which allow as little water and oxygen as possible to penetrate. As the sealing substrate 604, a plastic substrate formed of FRP (Fiberglass-Reinforced Plastics), PVF (polyvinyl fluoride), Mylar, polyester, acryl, or the like can be used besides a glass substrate or a quartz substrate.

As described above, the light emitting device including the light emitting element formed according to the present invention can be obtained.

The light emitting device shown in this embodiment mode includes the light emitting element described in any of Embodiment Modes 2 to 4, which can be operated with low drive voltage. Thus, a light emitting device with reduced power consumption can be obtained.

In addition, since the light emitting device shown in this embodiment mode does not require a driver circuit with high withstand voltage, manufacturing cost of the light emitting device can be reduced. In addition, reductions in weight of the light emitting device and size of a driver circuit portion can be achieved.

EMBODIMENT MODE 7

Embodiment Mode 7 will explain electronic devices of the present invention which includes, as a part thereof, the light emitting device described in any of Embodiment Modes 5 and 6. The electronic device shown in this embodiment mode includes the light emitting element described in any of Embodiment Modes 2 to 4. An electronic device with reduced power consumption can be provided because it includes a light emitting element with reduced drive voltage.

Examples of the electronic device manufactured according to the present invention are as follows: cameras such as video cameras or digital cameras, goggle type displays, navigation systems, sound reproducing devices (car audio systems, audio components, or the like), computers, game machines, portable information terminals (mobile computers, cellular phones, mobile game machines, electronic books, or the like), image reproducing devices having a recording medium (specifically, devices for reproducing a content of a recording medium such as digital versatile disc (DVD) and having a display for displaying the image), and the like. Specific examples of these electronic devices are shown in FIGS. 10A to 10D.

Figure 10A:
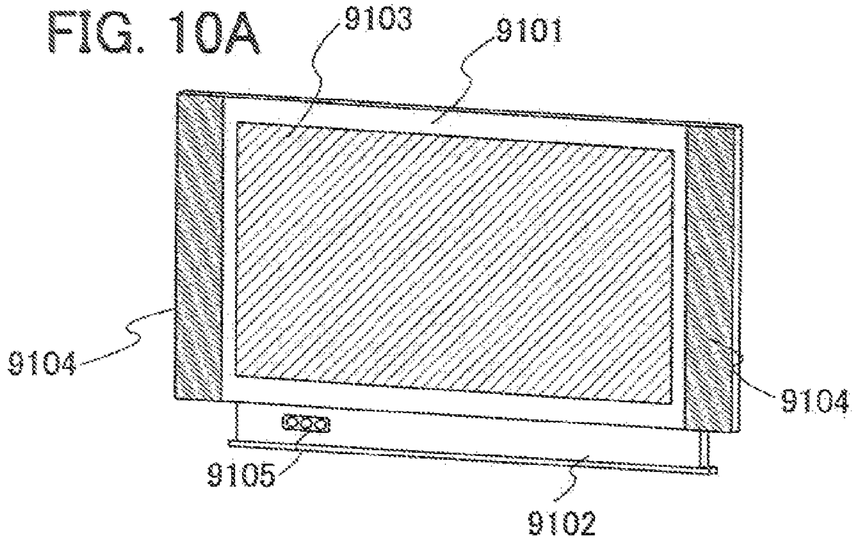
FIGS. 10A to 10D each show an electronic device according to an aspect of the present invention.

FIG. 10A shows a television device according to this embodiment mode, which includes a housing 9101, a support base 9102, a display portion 9103, a speaker portion 9104, a video input terminal 9105, and the like. In this television device, the display portion 9103 includes light emitting elements similar to those described in Embodiment Modes 2 to 4, that are arranged in matrix. The light emitting element has features of high luminous efficiency and low drive voltage. In addition, a short circuit due to impact from the outside, or the like can also be prevented. The display portion 9103 which includes the light emitting element also has a similar feature. Therefore, television device has less deterioration in image quality and consumes less power. With such features, a deterioration compensation circuit and a power supply circuit can be significantly reduced or downsized, thereby achieving reductions in size and weight of the housing 9101 and the support base 9102. Therefore, the housing 9101 and the support base 9102 can be made smaller and lighter. The television device of this embodiment mode has low power consumption, high image quality, and reduced size and weight. Therefore, a product which is suited to a living environment can be provided.

Figure 10B:
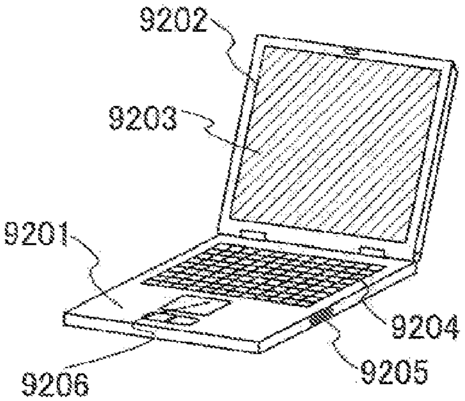

FIG. 10B shows a computer according to this embodiment mode, which includes a main body 9201, a housing 9202, a display portion 9203, a keyboard 9204, an external connection port 9205, a pointing mouse 9206, and the like. In this computer, the display portion 9203 includes light emitting elements similar to those described in Embodiment Modes 2 to 4, that are arranged in matrix. The light emitting element has features of high luminous efficiency and low drive voltage. In addition, a short circuit due to impact from the outside, or the like can also be prevented. The display portion 9203 which includes the light emitting element has a similar feature. Therefore, this computer has less deterioration in image quality and consumes less power consumption. With such features, a deterioration compensation circuit and a power supply circuit can be significantly reduced or downsized in the computer, thereby achieving reductions in size and weight of the main body 9201 and the housing 9202. Therefore, the main body 9201 and the housing 9202 can be made smaller and lighter. The computer of this embodiment mode has low power consumption, high image quality, and reduced size and weight, so a product which is suited to an environment can be provided. Further, the computer of this embodiment mode is portable, and has a display portion which can well withstand external impacts that occur when the computer is being carried.

Figure 10C:
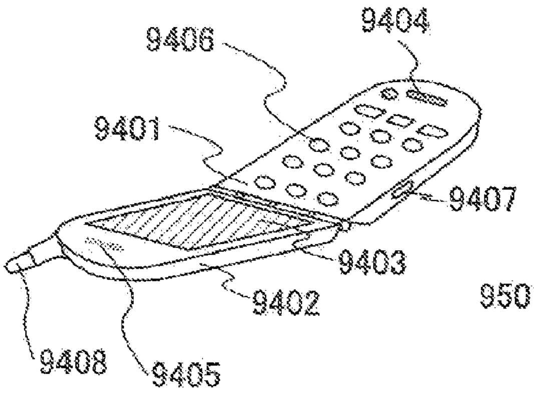

FIG. 10C shows a cellular phone according to this embodiment mode, which includes a main body 9401, a housing 9402, a display portion 9403, an audio input portion 9404, an audio output portion 9405, operation keys 9406, an external connection port 9407, an antenna 9408, and the like. In this cellular phone, the display portion 9403 includes light emitting elements similar to those described in Embodiment Modes 2 to 4, that are arranged in matrix. The light emitting element has features of high luminous efficiency and low drive voltage. In addition, a short circuit due to impact from the outside, or the like can also be prevented. The display portion 9403 which includes the light emitting element also has a similar feature. Therefore, this cellular phone has less deterioration in image quality and consumes less power. With such features, a deterioration compensation circuit and a power supply circuit can be significantly reduced or downsized in the cellular phone. Therefore, the main body 9401 and the housing 9402 can be made smaller and lighter. The portable telephone of this embodiment mode has low power consumption, high image quality, and reduced size and weight, so a product which is suited to being carried can be provided. Further, a product having a display portion which can well withstand external impacts that occur when the product is being carried can be provided.

Figure 10D:
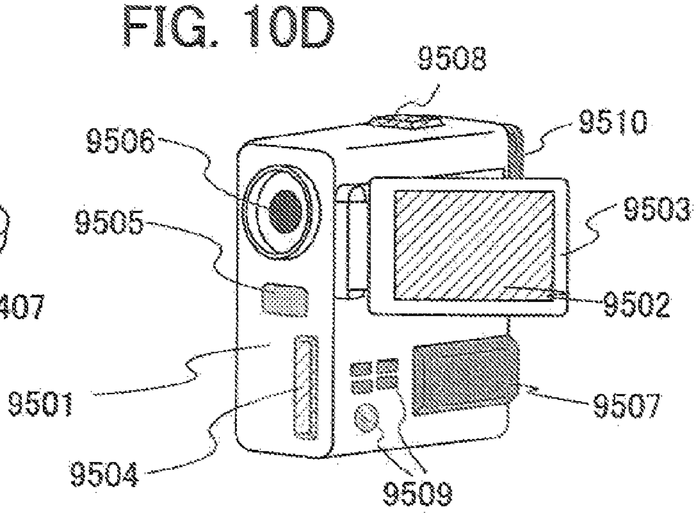

FIG. 10D shows a camera according to this embodiment mode, which includes a main body 9501, a display portion 9502, a housing 9503, an external connection port 9504, a remote control receiving portion 9505, an image receiving portion 9506, a battery 9507, an audio input portion 9508, an operation key 9509, an eyepiece portion 9510, and the like. In this camera, the display portion 9502 includes light emitting elements similar to those described in Embodiment Modes 2 to 4, which are arranged in matrix. The light emitting element has features of high luminous efficiency, low drive voltage, and capability of preventing a short circuit due to impact from the outside, or the like. The display portion 9502 which includes the light emitting element also has similar features. Therefore, this camera has less deterioration in image quality and consumes less power. With such features, a deterioration compensation circuit and a power supply circuit can be significantly reduced or downsized in the camera. Therefore, the main body 9501 of the camera can be made smaller and lighter. The camera of this embodiment mode has low power consumption, high image quality, and reduced size and weight, so a product which is suited to being carried can be provided. Further, a product having a display portion which can well withstand external impacts that occur when the product is being carried can be provided.

Figure 15:
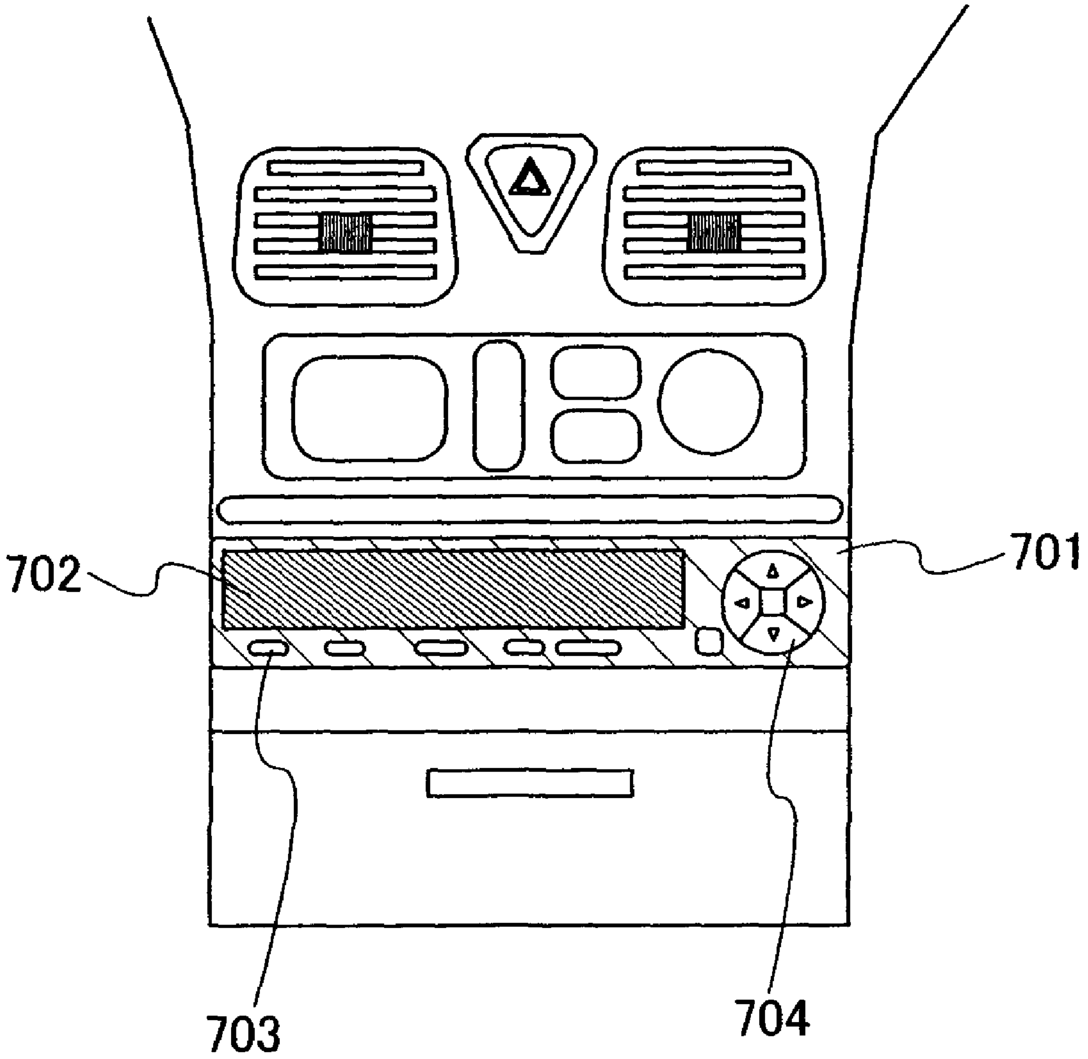
FIG. 15 shows an electronic device according to an aspect of the present invention.

FIG. 15 shows an audio reproduction device, specifically, a car audio system. The audio reproduction device includes a main body 701, a display portion 702, and operation switches 703 and 704. The display portion 702 can be formed by the light-emitting device (passive type) shown in Embodiment Mode 5 or the light-emitting device (active type) shown in Embodiment Mode 6. Further, the display portion 702 may employ a segment type light-emitting device. In any case, by using a light-emitting material of the present invention, a display portion can be formed that is capable of bright display even when using a vehicular power source (12 to 42 V). The display portion has lower power consumption and a longer life. Further, although this embodiment mode has shown an in-car audio system, the light-emitting device of the present invention may also be used in portable audio systems or audio systems for home use.

Figure 16:
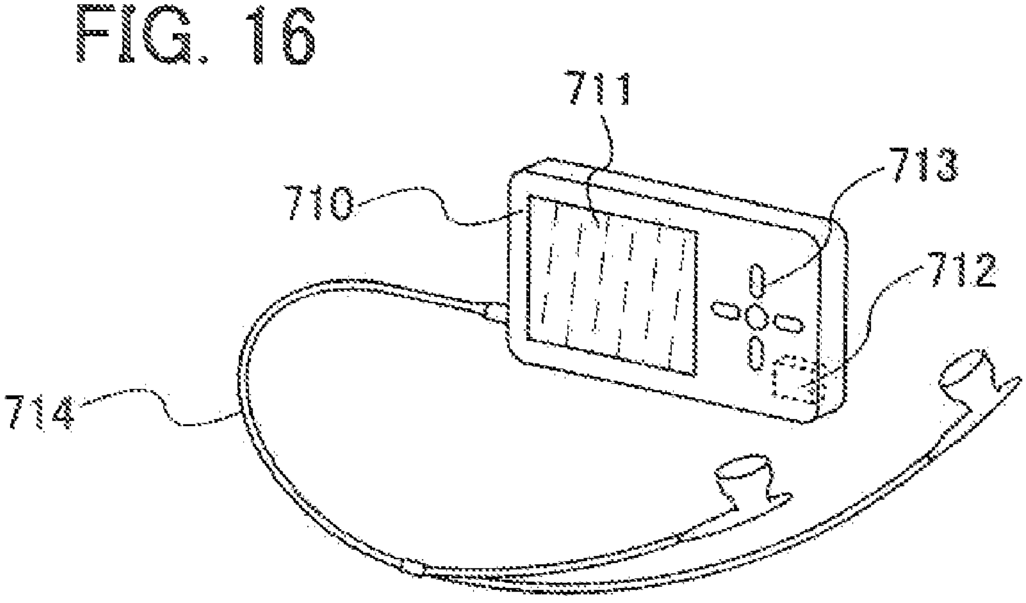
FIG. 16 shows an electronic device according to an aspect of the present invention.

FIG. 16 shows a digital player as one example of that. The digital player shown in FIG. 16 includes a main body 710, a display portion 711, a memory portion 712, an operation portion 713, a pair of earphones 714, and the like. Note that a pair of headphones or a wireless pair of earphones can be used instead of the pair of earphones 714. The display portion 711 can be formed by the light-emitting device (passive type) shown in Embodiment Mode 5 or the light-emitting device (active type) shown in Embodiment Mode 6. Further, the display portion 711 may employ a segment type light-emitting device. In any case, by using a light-emitting material of the present invention, a display portion can be formed that is capable of bright display even when using a secondary battery (a nickel-hydrogen battery or the like). The display portion has lower power consumption and a longer life. As the memory portion 712, a hard disk or a nonvolatile memory is used. For example, a NAND type flash memory with a recording capacity of 20 to 200 gigabytes (GB) is used, and by operating the operation portion 713, an image or a sound (e.g., music) can be recorded and reproduced. In the display portions 704 and 711, white characters are displayed against a black background, and thus, power consumption can be reduced. This is particularly effective for portable audio systems.

As described above, the range of application of the light emitting device manufactured according to the present invention is very wide. The light emitting device can be applied to electronic devices in all kinds of fields. By applying the present invention, an electronic device including a display portion which consumes less power and has high reliability can be manufactured.

In addition, the light emitting device to which the present invention is applied can also be used as a lighting system. One mode of using the light emitting element to which the present invention is applied as a lighting system will be described with reference to FIG. 11.

Figure 11:
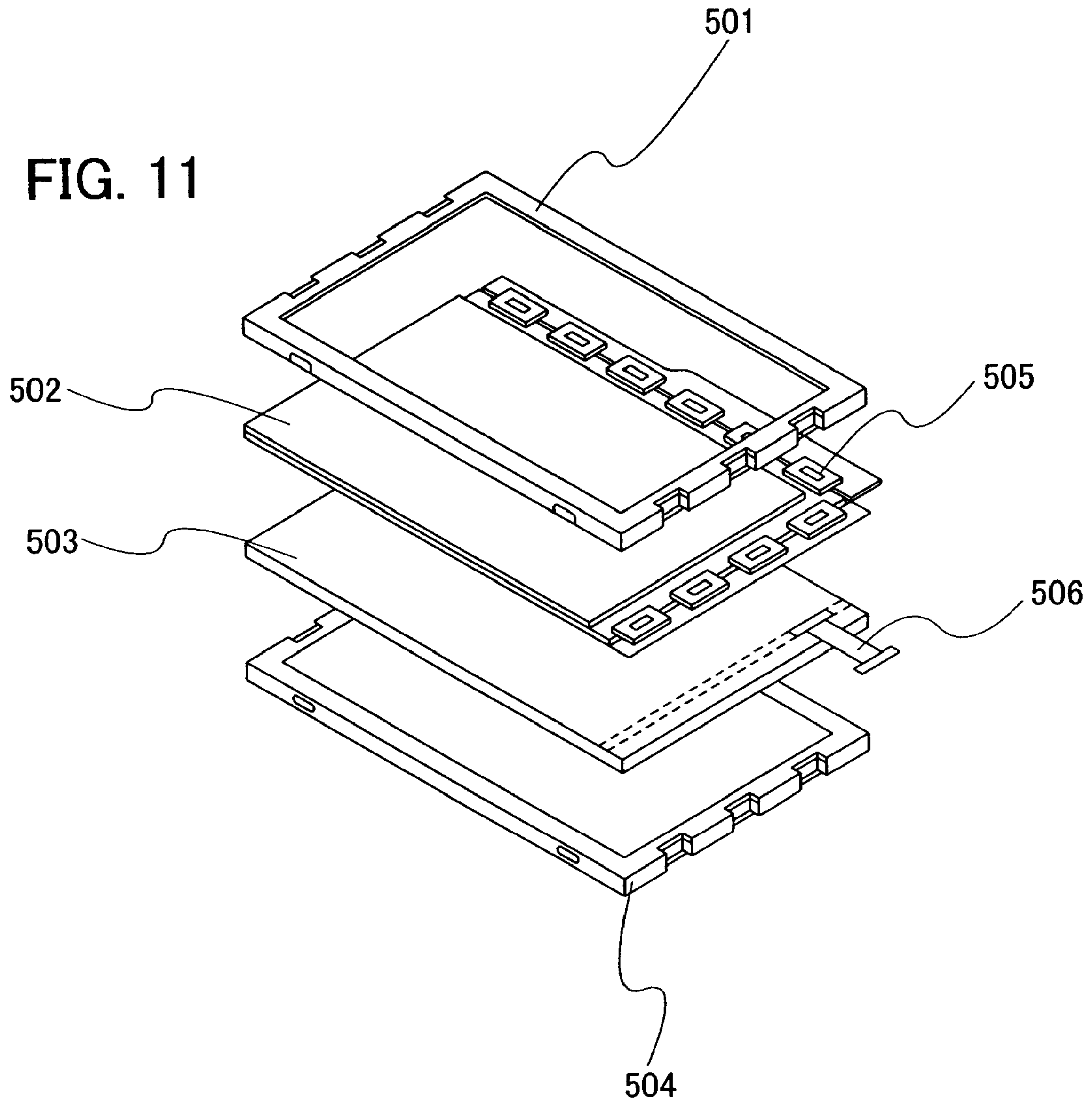
FIG. 11 shows a lighting system according to an aspect of the present invention.

FIG. 11 shows an example of a liquid crystal display device using the light emitting device to which the present invention is applied as a backlight. The liquid crystal display device shown in FIG. 11 includes a housing 501, a liquid crystal layer 502, a backlight 503, and a housing 504. The liquid crystal layer 502 is connected to a driver IC 505. The light emitting device of the present invention is used as the backlight 503, to which a voltage is supplied through a terminal 506.

By using the light emitting device of the present invention as a backlight of a liquid crystal display device, a backlight with high luminance and long life can be obtained; therefore, the quality as a display device is improved. Further, since a light emitting device of the present invention is a plane emission light emitting device and can have a large surface area, the backlight can have a large surface area, so the liquid crystal display device can also have a large surface area. Further, since the light emitting element is slim and has low power consumption, the display device can be made slimmer and can have reduced power consumption.

Figure 12A:
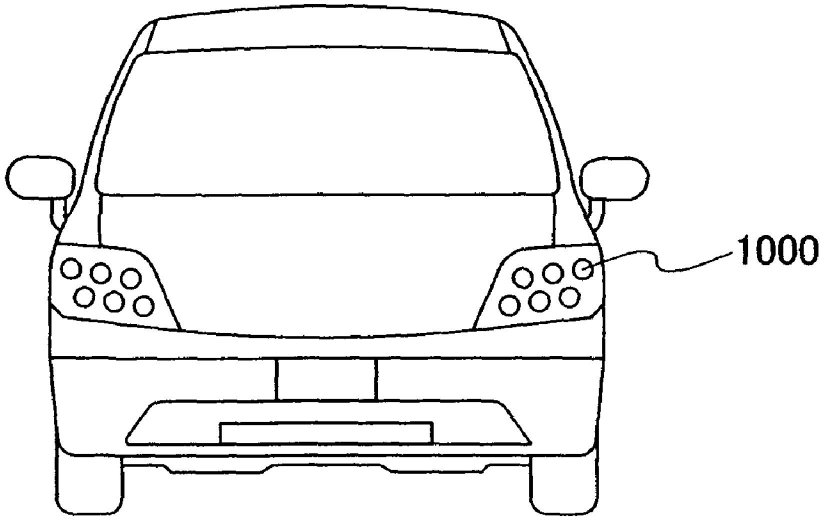
FIGS. 12A to 12C show a lighting system according to an aspect of the present invention.
Figure 12B:
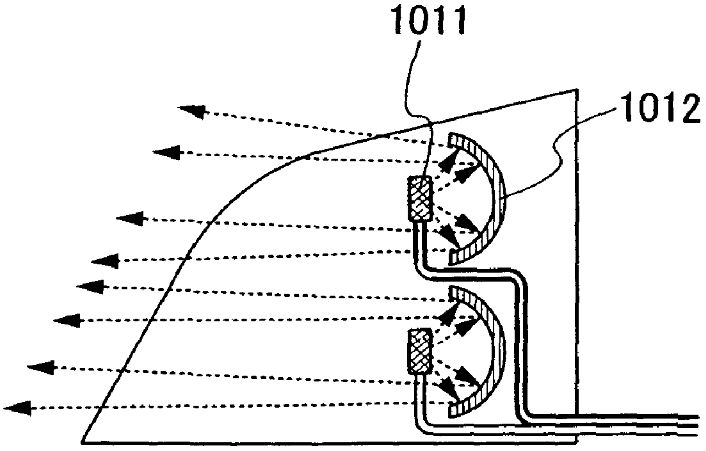
Figure 12C:
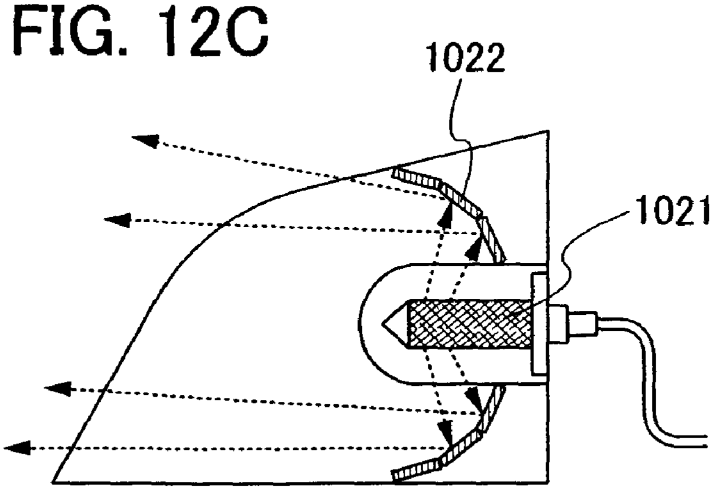

Furthermore, since a light emitting device to which the present invention is applied can emit light with high luminance, it can be used as a headlight of a car, bicycle, ship, or the like. FIGS. 12A to 12C show an example in which a light emitting device to which the present invention is applied is used as a headlight of a car FIG. 12B is an enlarged cross-sectional view showing a headlight 1000 of FIG. 12A. In FIG. 12B, the light emitting device of the present invention is used as a light source 1011. Light emitted from the light source 1011 is reflected on a reflector 1012 and taken outside. As shown in FIG. 12B, light with higher luminance can be obtained by using a plurality of light sources. FIG. 12C is an example in which a light emitting device of the present invention that is manufactured in a cylindrical shape is used as a light source. Light emitted from the light source 1021 is reflected on a reflector 1022 and taken outside.

Figure 13:
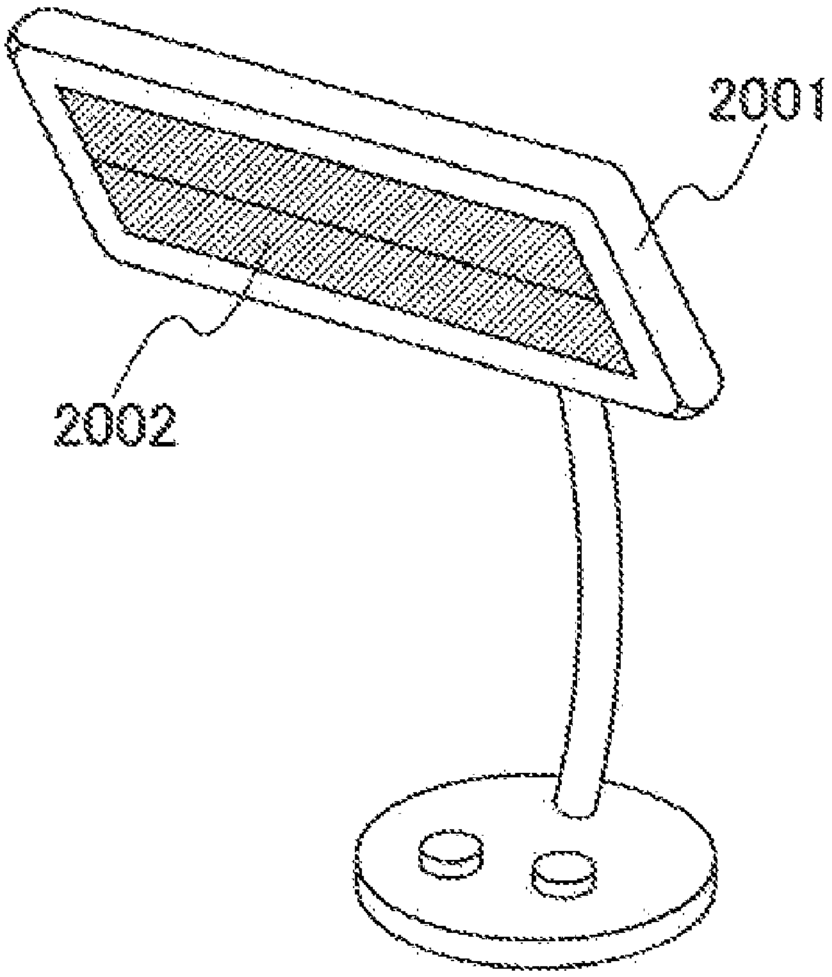
FIG. 13 shows a lighting system according to an aspect of the present invention.

FIG. 13 shows an example in which a light emitting device to which the present invention is applied is used as a desk lamp that is one of lighting systems. The desk lamp shown in FIG. 13 includes a housing 2001 and a light source 2002, and the light emitting device of the present invention is used as the light source 2002. Since the light emitting device of the present invention can emit light with high luminance, it can brightly illuminate hands in a case such as where fine handwork is being done.

Figure 14:
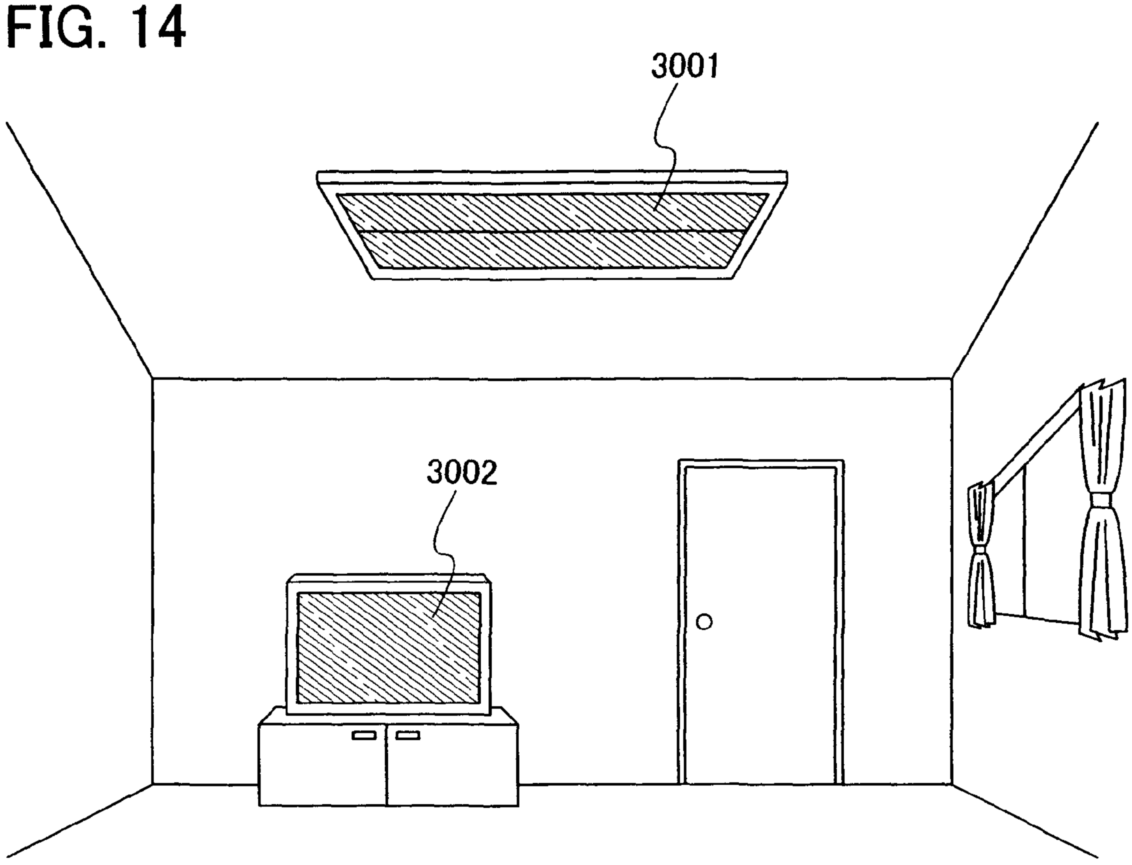
FIG. 14 shows a lighting system according to an aspect of the present invention.

FIG. 14 shows an example in which a light emitting device to which the present invention is applied is used as an interior lighting system 3001. Since the light emitting device of the present invention can have a large area, it can be used as a large-area lighting system. In addition, since the light emitting device of the present invention is thin and consumes less power, it can be used as a thin lighting system with less power consumption. As shown in the drawing, a television device 3002 of the present invention as explained in FIG. 10A may be set in a room where the light emitting device to which the present invention is applied is used as the indoor lighting system 3001, and public broadcasting or movies can be appreciated there. In such a case, powerful images can be appreciated in a bright room while saving electricity costs, because both the lighting system and the television device consume less power.

Lighting systems are not limited to those exemplified in FIGS. 12A to 12C, 13, and 14, and the light emitting device of the present invention can be applied to lighting systems in various modes, including lighting systems for houses and public facilities. In such cases, the light emitting medium of the lighting system of the present invention is a thin film, which increases design freedom. Accordingly, various elaborately-designed products can be provided to the marketplace.

This application is based on Japanese Patent Application Ser. No. 2006-058579 filed in Japan Patent Office on Mar. 3, 2006, the entire contents of which are hereby incorporated by reference.

Explanation of Reference Numerals

100: substrate, 101: first electrode, 102: first insulating layer, 103: light-emitting layer, 104: second insulating layer, 105: second electrode, 200: substrate, 201: first electrode, 202: light-emitting layer, 203: insulating layer, 204: second electrode, 301: first electrode, 302: second electrode, 311: first light-emitting unit, 312: second light-emitting unit, 313: charge generation layer, 410: substrate, 412: counter substrate, 414: display portion, 416: first electrode, 418: second electrode, 420: flexible wiring board, 424: partition layer, 426: EL layer, 428: auxiliary electrode, 430: color conversion layer, 432: filler, 501: housing, 502: liquid crystal layer, 503: backlight, 504: housing, 505: driver IC, 506: terminal, 601: source side driver circuit, 602: pixel portion, 603: gate side driver circuit, 604: sealing substrate, 605: sealant, 607: space, 608: lead wiring, 609: FPC (flexible print circuit), 610: element substrate, 611: switching TET, 612: current control TFT, 613: first electrode, 614: insulator, 616: EL layer, 617: second electrode, 618: light-emitting element, 623: n-channel TFT, 624: p-channel TFT, 701: main body, 702: display portion, 703: operation switch, 704: display portion, 710: main body, 711: display portion, 712: memory portion, 713: operation portion, 714: earphone, 623: n-channel TFT, 624: p-channel TFT, 952: first electrode, 953: insulating layer, 954: partition layer, 955: EL layer, 956: second electrode, 1000: headlight, 1011: light source, 1012: reflector, 1021: light source, 1022: reflector, 2001: housing, 2002: light source, 3001: lighting system, 9101: housing, 9102: support base, 9103: display portion, 9104: speaker portion, 9105: video input terminal, 9201: main body, 9202: housing, 9203: display portion, 9204: keyboard, 9205: external connection port, 9206: pointing mouse, 9401: main body, 9402: housing, 9403: display portion, 9404: audio input portion, 9405: audio output portion, 9406: operation key, 9407: external connection port, 9408: antenna, 9501: main body, 9502: display portion, 9503: housing, 9504: external connection port, 9505: remote control receiving portion, 9506: image receiving portion, 9507: battery, 9508: audio input portion, 9509: operation key, 9510: eyepiece portion

The invention claimed is:

1. A light emitting device comprising:

a light emitting element; and a control circuit which controls emission of the light emitting element, wherein the light emitting element comprises a light emitting layer between a pair of electrodes, and wherein the light emitting layer comprises a light emitting material comprising:

at least one inorganic compound selected from the group consisting of sulfide, nitride and oxide, as a base material;

at least one element selected from the group consisting of copper, silver, aluminum, fluorine and chorine;

manganese; and at least one gallium compound selected from the group consisting of gallium phosphide and gallium antimonide.

2. The light emitting device according to claim 1, wherein the sulfide is at least one of zinc sulfide, cadmium sulfide, calcium sulfide, yttrium sulfide, gallium sulfide, strontium sulfide, and barium sulfide, wherein the nitride is at least one of aluminum nitride, gallium nitride, and indium nitride, and wherein the oxide is at least one of zinc oxide, and yttrium oxide.

3. A light emitting element comprising:

a light emitting layer between a pair of electrodes, wherein the light emitting layer comprises a light emitting material comprising:

at least one inorganic compound selected from the group consisting of sulfide, nitride and oxide, as a base material;

at least one element selected from the group consisting of copper, silver, aluminum, fluorine and chorine;

manganese; and at least one gallium compound selected from the group consisting of gallium phosphide and gallium antimonide.

4. The light emitting element according to claim 3, wherein the sulfide is at least one of zinc sulfide, cadmium sulfide, calcium sulfide, yttrium sulfide, gallium sulfide, strontium sulfide, and barium sulfide, wherein the nitride is at least one of aluminum nitride, gallium nitride, and indium nitride, and wherein the oxide is at least one of zinc oxide, and yttrium oxide.

5. A light emitting material comprising:

at least one inorganic compound selected from the group consisting of sulfide, nitride and oxide, as a base material;

at least one element selected from the group consisting of copper, silver, aluminum, fluorine and chorine;

manganese; and at least one gallium compound selected from the group consisting of gallium phosphide and gallium antimonide.

6. The light emitting material according to claim 5, wherein the sulfide is at least one of zinc sulfide, cadmium sulfide, calcium sulfide, yttrium sulfide, gallium sulfide, strontium sulfide, and barium sulfide, wherein the nitride is at least one of aluminum nitride, gallium nitride, and indium nitride, and wherein the oxide is at least one of zinc oxide, and yttrium oxide.

7. An electronic device comprising:

a display portion, wherein the display portion comprises:

a light emitting element; and a control circuit which controls emission of the light emitting element, wherein the light emitting element comprises a light emitting layer between a pair of electrodes, and wherein the light emitting layer comprises a light emitting material comprising:

at least one inorganic compound selected from the group consisting of sulfide, nitride and oxide, as a base material;

at least one element selected from the group consisting of copper, silver, aluminum, fluorine and chorine;

manganese; and at least one gallium compound selected from the group consisting of gallium phosphide and gallium antimonide.

8. The electronic device according to claim 7, wherein the sulfide is at least one of zinc sulfide, cadmium sulfide, calcium sulfide, yttrium sulfide, gallium sulfide, strontium sulfide, and barium sulfide, wherein the nitride is at least one of aluminum nitride, gallium nitride, and indium nitride, and wherein the oxide is at least one of zinc oxide, and yttrium oxide.

* * * * *